(12) United States Patent
Das

(10) Patent No.: US 7,790,560 B2
(45) Date of Patent: Sep. 7, 2010

(54) CONSTRUCTION OF FLASH MEMORY CHIPS AND CIRCUITS FROM ORDERED NANOPARTICLES

(75) Inventor: Biswajit Das, Henderson, NV (US)

(73) Assignee: Board of Regents of the Nevada System of Higher Education, Las Vegas, NV (US)

( * ) Notice: Subject to any disclaimer, the term of this patent is extended or adjusted under 35 U.S.C. 154(b) by 103 days.

(21) Appl. No.: 12/075,523

(22) Filed: Mar. 12, 2008

(65) Prior Publication Data

US 2008/0230826 A1    Sep. 25, 2008

Related U.S. Application Data

(60) Provisional application No. 60/906,396, filed on Mar. 12, 2007.

(51) Int. Cl.
*H01L 21/00* (2006.01)
(52) U.S. Cl. .................. 438/287; 438/264; 438/593; 977/774; 977/785; 977/936
(58) Field of Classification Search .......... 438/287, 438/264, 593; 977/774, 785, 936
See application file for complete search history.

(56) References Cited

U.S. PATENT DOCUMENTS

| | | | | |
|---|---|---|---|---|
| 5,714,766 | A | 2/1998 | Chen et al. ............... 257/17 |
| 5,936,258 | A * | 8/1999 | Imamura et al. .......... 257/21 |
| 5,937,295 | A | 8/1999 | Chen et al. ............... 438/257 |
| 6,016,269 | A | 1/2000 | Peterson et al. ........... 365/171 |
| 6,097,627 | A | 8/2000 | Peterson et al. ........... 365/175 |
| 6,165,842 | A | 12/2000 | Shin et al. ............... 438/257 |
| 6,171,909 | B1 | 1/2001 | Ding et al. .............. 438/267 |
| 6,372,077 | B1 | 4/2002 | Tecle ................... 156/279 |
| 6,465,293 | B2 | 10/2002 | Park et al. .............. 438/214 |
| 6,572,673 | B2 | 6/2003 | Lee et al. ................ 75/362 |
| 6,585,796 | B2 | 7/2003 | Hosokura et al. ......... 75/373 |
| 6,586,785 | B2 * | 7/2003 | Flagan et al. ............ 257/261 |
| 6,587,408 | B1 * | 7/2003 | Jacobson et al. .......... 369/44.16 |
| 6,597,496 | B1 * | 7/2003 | Nayfeh et al. ............ 359/343 |
| 6,723,606 | B2 * | 4/2004 | Flagan et al. ............ 438/264 |
| 6,833,019 | B1 | 12/2004 | Lewis, III et al. ......... 75/345 |
| 6,878,184 | B1 | 4/2005 | Rockenberger et al. ..... 75/343 |
| 6,913,984 | B2 | 7/2005 | Kim et al. .............. 438/432 |
| 6,927,136 | B2 | 8/2005 | Lung et al. .............. 438/288 |
| 6,960,425 | B2 | 11/2005 | Jung et al. .............. 430/323 |
| 6,984,842 | B1 * | 1/2006 | Nayfeh et al. ............ 257/14 |
| 7,033,416 | B2 | 4/2006 | Kurihara et al. .......... 75/351 |
| 7,078,276 | B1 | 7/2006 | Zurcher et al. ........... 438/151 |
| 7,173,304 | B2 | 2/2007 | Weimer et al. ........... 257/315 |

(Continued)

*Primary Examiner*—Laura M Menz
(74) *Attorney, Agent, or Firm*—Mark A. Litman & Associates P.A.

(57) ABSTRACT

Methods, apparatus and systems form memory structures, such as flash memory structures from nanoparticles by providing a source of nanoparticles as a conductive layer. The particles are moved by application of a field, such as an electrical field, magnetic field and even electromagnetic radiation. The nanoparticles are deposited onto an insulating surface over a transistor in a first distribution of the nanoparticles. A field is applied to the nanoparticles on the surface that applies a force to the particles, rearranging the nanoparticles on the surface by the force from the field to form a second distribution of nanoparticles on the surface. A protective and enclosing insulating layer is deposited on the nanoparticle second distribution. The addition of a top conductive layer completes a basic flash memory structure.

15 Claims, 11 Drawing Sheets

U.S. PATENT DOCUMENTS

| | | | |
|---|---|---|---|
| 7,250,653 B2 | 7/2007 | Kim et al. | 257/324 |
| 7,382,017 B2 * | 6/2008 | Duan et al. | 257/321 |
| 7,544,990 B2 * | 6/2009 | Bhattacharyya | 257/315 |
| 7,595,528 B2 * | 9/2009 | Duan et al. | 257/321 |
| 2002/0066923 A1 | 6/2002 | Jong et al. | 257/316 |
| 2005/0164480 A1 | 7/2005 | Haubrich et al. | 438/597 |
| 2005/0201149 A1 * | 9/2005 | Duan et al. | 365/185.03 |
| 2006/0205132 A1 | 9/2006 | Bhattacharyya | 438/197 |
| 2007/0187768 A1 * | 8/2007 | Duan et al. | 257/368 |
| 2007/0247904 A1 * | 10/2007 | Duan et al. | 365/185.03 |
| 2008/0026532 A1 * | 1/2008 | Duan et al. | 438/287 |
| 2008/0230826 A1 * | 9/2008 | Das | 257/316 |

* cited by examiner

CONSTRUCTION OF FLASH MEMORY CHIPS AND CIRCUITS FROM ORDERED NANOPARTICLES

RELATED APPLICATIONS DATA

The present application claims priority from U.S. Provisional Application U.S. Ser. No. 60/906,396, filed Mar. 12, 2007 which application is incorporate herein by reference in its entirety.

BACKGROUND OF THE INVENTION

1. Field of the Invention

The present invention relates to the field of nanoparticles and nanotechnology, fabrication of nanotechnology, fabrication of patterned and ordered nanotechnology and devices, and fabrication of memory devices such as flash memory devices from the ordered nanoparticles. The invention also relates to the field of fabrication of electronic, electrical and photonic devices using nanotechnology.

2. Background of the Art

A flash memory device is a nonvolatile memory device. Depending on a cell array configuration, the flash memory device may be formed as a NAND flash device, which requires no contact pattern to connect each cell transistor, or a NOR flash device, which has contact patterns for each cell transistor. NAND flash memory, which uses serially configured cell transistors, i.e., a cell string, provides no random access capability but, without the contact patterns, is more suitable for forming highly integrated (mass storage) devices. By contrast, NOR flash memory enables random access but, due to a contact pattern formation for each cell transistor, is less desirable for embodying highly integrated memory devices.

A semiconductor memory device may also be classified as either volatile or non-volatile. Volatile semiconductor memory devices, such as dynamic random access memory (DRAM) devices and/or static random access memory (SRAM) devices, have a relatively high response speed. However, the volatile semiconductor memory devices lose data stored therein when power is shut off. Although non-volatile semiconductor memory devices, such as electrically erasable programmable read only memory (EEPROM) devices and/or flash memory devices, have a relatively slow response speed, non-volatile semiconductor memory devices can maintain data stored therein when power is shut off. In EEPROM devices, data is electrically stored (i.e., programmed) or erased through a Fowler-Nordheim (F-N) tunneling mechanism and/or a channel hot electron injection mechanism.

For example, U.S. Pat. No. 6,465,293 discloses a method of manufacturing a flash memory cell. In accordance with the disclosure in U.S. Pat. No. 6,465,293, a method of manufacturing a flash memory cell includes the steps of forming an oxide layer on a semiconductor substrate in which a device isolation layer is formed, patterning the oxide layer to expose the semiconductor substrate at a portion in which a floating gate will be formed to thereby form an oxide layer pattern, sequentially forming a tunnel insulating layer and a first polysilicon layer on the entire structure, planarizing the first polysilicon layer until the oxide layer pattern is exposed to thereby form a floating gate, etching the tunnel insulating layer and the oxide layer pattern in the exposed portion to a given thickness, forming a dielectric layer on the entire structure, sequentially forming a second polysilicon layer, a tungsten silicide layer and a hard mask, patterning the second polysilicon layer, the tungsten silicide layer and the hard mask to form a control gate, and injecting impurity ions into the semiconductor substrate at the both sides of the floating gate to form a junction region.

The floating gate is self-aligned by the oxide layer pattern partially exposing the semiconductor substrate.

As a packing density of the semiconductor device has become more highly integrated, an aspect ratio of an opening defined by the oxide layer pattern (by which a portion of the semiconductor substrate is exposed) has been increased, thereby generating void(s) in the first polysilicon layer filling up the opening. The void(s) generated in the first polysilicon layer is opened during the planarization process of the first polysilicon layer, and thus an opened seam is formed at a surface of the floating gate. The opened seam deteriorates a breakdown voltage characteristic of the dielectric film formed on the floating gate and a coupling ratio of the flash memory device. Further, leakage current characteristic through the dielectric film is deteriorated.

Another isolation technique called shallow trench isolation (STI) has been introduced to the fabrication of nonvolatile memory devices to reduce the cell size. The conventional field oxides are replaced by STI structures so that the device integration can be effectively improved. However, as component dimensions continue to shrink, the surface area of floating gates also shrinks. This leads directly to a decrease in capacitance of the effective capacitor formed between the floating gate layer and the control gate layer. This decrease in effective capacitance results in a reduction of the capacitive coupling ratio, which is a parameter that describes the coupling to floating gate of the voltage applied to control gate. The poorly-coupled voltage to floating gate limits the programming and accessing speed characteristics of the memory device.

The capacitive coupling ratio $C_p$ is defined by:
$$1C_p = C_{cf}C_{cf} + C_{fs}$$
where $C_{cf}$ is capacitance between the control gate and the floating gate; and $C_{fs}$ is capacitance between the floating gate and the semiconductor substrate.

To improve programming and accessing speeds in non-volatile memories, many attempts have been made to increase the coupling ratio. It can be understood from the above equation that when the capacitance Ccf between the control gate and the floating gate increases, the coupling ratio Cp increases. Therefore, the coupling ratio Cp is generally increased by increasing the capacitor area between the floating gate and control gate, which increases the capacitance Ccf, and therefore the coupling ratio Cp. For example, U.S. Pat. No. 6,171,909 discloses a method for forming a stacked gate of a flash memory cell. The coupling ratio of the stacked gate is increased by forming a conductive spacer. The conductive spacer, which is a portion of the floating gate, increases the capacitor area between the floating gate and control gate.

Nanotechnology is an anticipated manufacturing technology giving thorough, inexpensive control of the structure of matter through the manipulation of individual atoms. The term has been used to refer to any attempt to work at the submicron scale, but this site mainly covers the subset usually called molecular nanotechnology. Broadly speaking, the central thesis of nanotechnology is that almost any chemically stable structure can be built from a dimensional level that includes final structures having at least one dimension remaining in the realm of from about 0.2 to 50 nanometers. Other dimensions, such as lengths of tubes, may exceed these ranges, but diameters and/or thicknesses may remain within that dimensional realm.

Presently, the vast majority of commercial manufacturing technologies manipulate millions and billions of atoms at a time using conventional shaping technologies. Atoms and molecules are shaped into products by pounding, molding, extruding, deposition, coating, chipping, etching and other large scale mechanical deformation and accumulation technologies. For example, chips can be made by forming pure silicon substrates and then etching and depositing patterns of atoms and molecules on its surface. These techniques depend on large scale manipulation of atomic and molecular materials. The present commercial systems and techniques for the manipulation of molecules and atoms into small masses, such as those associated with nanotechnology is still too high an order of complexity today for existing mass production techniques to be applied to nanotechnology. The quality of the control of the deposition of atomic materials requires the sacrifice of manufacturing speeds to assure quality replication of intended designs. In the future, molecular nanotechnology will require more sophisticated yet high speed control over the placement of individual atoms.

Often, nanotechnology is referred to as "bottom-up" manufacturing. Its aim is to start with the smallest possible building materials, atoms and molecules, and use them to create a desired product. Working with individual atoms and individual molecules allows the atom-by-atom or molecule by molecule design of structures.

Single-wall carbon nanotubes have been made in a DC arc discharge apparatus by simultaneously evaporating carbon and a small percentage of Group VIIIb transition metal from the anode of the arc discharge apparatus. These techniques allow production of only a low yield of carbon nanotubes, and the population of carbon nanotubes exhibits significant variations in structure and size.

A major challenge facing nanotechnology today is the fabrication of electronic and photonic devices in a commercially viable manner. One prerequisite for such commercial applications lies in the ability to enable mass fabrication as well as the ability to create 'ordering and patterning' of a large number of nanoparticles in a cost effective manner. One methodology for forming patterned nanotubes is a photo-lithographic process, such as that described in U.S. Pat. No. 6,960,425 (Jung et al.). In the Jung et al. Patent, a method for forming a pattern of carbon nanotubes includes forming a pattern on a surface-treated substrate using a photolithographic process, and laminating carbon nanotubes thereon using a chemical self-assembly process so as to form the carbon nanotubes in a monolayer or multilayer structure. A monolayer or multilayer carbon nanotube pattern may be easily formed on the substrate, e.g., glass, a silicon wafer and a plastic. Accordingly, the method can be applied to form patterned carbon nanotube layers having a high conductivity, and thus will be usefully utilized in the manufacturing processes of energy storages, for example, solar cells and batteries, flat panel displays, transistors, chemical and biological sensors, semiconductor devices and the like. The technology thus forms the distribution of pattern seeds by photolithography, and then grows the seeds by other deposition methods.

Various methods, apparatus and materials for providing materials for growth of nanotubes are disclosed, for example, in US Patents and Applications such as U.S. Pat. No. 7,052,668, which are incorporated herein by reference in their entirety for their disclosures, as are all other applications, patents and articles referenced herein.

Nanoparticles, conductive nanoparticles of carbon, metals and the like, have been known and enabled to the industry for many years. Examples of US Patent disclosures of such particles and processes are provided, by way of non-limiting examples, in U.S. Pat. Nos. 7,078,276; 7,033,416; 6,878,184; 6,833,019; 6,585,796; 6,572,673; 6,372,077; and the like, each of which are incorporated in their entirety herein by reference.

US Published Application No. 20050164480 discloses methods for making electronic devices with a thin anisotropic conducting layer interface layer formed between a substrate and an active device layer that is preferably patterned conductive layer. The interface layer preferably provides Ohmic and/or rectifying contact between the active device layer and the substrate and preferably provides good adhesion of the active device layer to the substrate. The active device layer is preferably fashioned from a nanoparticle ink solution that is patterned using embossing methods or other suitable printing and/or imaging methods. The active device layer is preferably patterned into an array of gate structures suitable for the fabrication of thin film transistors and the like.

One promising field of use for nanotechnology is in the venue of nano-structured memory devices (e.g., U.S. Pat. Nos. 5,714,766 and 5,937.295), non-volatile memory cells (e.g., U.S. Pat. No. 6,927,136), SONOS memory devices with nano-sized memory traps (U.S. Pat. No. 7,250,653), and Quantum random access memories with nanostructure therein (U.S. Pat. Nos. 6,016,269 and 6,097,627), which are incorporated herein by reference. Methods and materials for production of memory systems and platforms and substrates for nanotechnology memory systems are also disclosed in U.S. Pat. Nos. 6,165,842 and 6,913,984, which are incorporated herein by reference.

U.S. Pat. No. 7,173,304 (Weimer et al.) discloses methods and compositions for forming a first layer of insulating material above a semiconducting substrate, forming an aluminum oxide layer above the first layer of insulating material, forming a plurality of spaced-apart dots of material on the aluminum oxide layer, forming a second layer of insulating material on portions of the aluminum oxide layer not covered by the spaced-apart dots of material, forming a conductive layer above the second layer of insulating material and the plurality of spaced-apart dots of material, and removing excess portions of the layer of conductive material and the second layer of insulating material. A device is disclosed that may include a substrate and a floating gate electrode positioned above a tunnel insulation layer, the floating gate electrode including a layer of insulating material and a plurality of spaced-apart dots of material, each of which have a conductive nano-dot positioned on the dot of material, the dots of material and the conductive nano-dots being positioned in the layer of insulating material. Nanoparticles are deposited on an aluminum oxide layer without ordering of the distribution and location of the nanoparticles in the formation of the gates.

Published U.S. Patent Application No. 20060205132 (Bhattacharyya) describes a scalable, logic transistor has a pair of doped regions for the drain and source. A gate insulator layer is formed over the substrate and between the drain and source regions. A gate stack is formed of a gate layer, such as polysilicon or metal, between two metal nitride layers. A compatible non-volatile memory transistor can be formed from this basic structure by adding a high-K dielectric constant film with an embedded metal nano-dot layer between the tunnel insulator and the gate stack.

All patents, patent applications and articles cited and referenced herein are incorporated by reference in their entireties.

Nanotechnology has not yet been developed on a commercial scale, but molecular models of possible nanomachines are becoming increasingly common. Often, these models analyze the basic tools necessary for a nanotechnological part that could go into tools such as an assembler. It is a fundamental need of the future of nanotechnology to find basic manufacturing processes and schemes that can be used to mass produce and accurately produce surfaces and materials that provide advances in nanotechnology and its systems.

SUMMARY OF THE INVENTION

In one perspective of the present technology, nanoparticles having an initially relatively uniform size distribution are provided onto a surface for permanent or temporary formation into a subsequent article or component of manufacture. The particles are arranged by applied forces to form a desired distribution on the surface, especially a relatively uniform or evenly spaced distribution (e.g., with a standard deviation of number average relative proximity between particles of ±50%, 40%, 30%, 25%, 20%, 15%, 10%, and even 5% or less than each of these values The particles are usually electrically charged (e.g., triboelectrically, positive or negative, etc.) before they are applied to a carrier surface, when they are applied or after applied, as by field charging of the particles after they have been non-uniformly deposited on a carrier surface) particles or magnetically susceptible particles, or any other field maneuverable particles which assists in their deposition and/or reorientation/redistribution upon the surface without permanent bonding of the particles to an initial position where the particles have been deposited on the surface. The particles may be temporarily deposited on the surface in a fairly random or completely random pattern by any available particle generation and particle transport system, such as mass application, such as dusting, spraying, non-image wise toning, electrostatic toning, etc. The particles are then subjected to a uniform or pulsed or otherwise ordered field to redistribute the particles on the surface, which is why the particles are not initially permanently fixed at a position on the surface. The redistribution of the particles is done in a manner that distributes the particles in a more ordered arrangement and even in specifically ordered and designed patterns on the surface. The particles are then retained on the surface (e.g., fixed, as by heating, coating, bonding, chemical reaction or other physical or chemical means) or transferred (e.g., by a subsequent field driven transfer mechanism, pressure, or heat and pressure) to a permanent substrate or further intermediate transfer substrate. An Atomic Force Microscope (AFM), field array, electron beam, semi-conductor array, wide area array and other technologically available systems are among the means of creating or directing a field in a manner that can assist in particularly relocating the nanoparticles on or onto the initial temporary surface by applying an (e.g., the term "electrical" will be used to generically include any of the forces that can be used as elsewhere described herein) field that redistributes the particles according to the effects of the applied field from the source, such as, but not limited to an AFM. The field may be continuous or pulsed or non-uniformly periodic and the resolution of the application of the field and its effects corresponds closely with the field resolution of the AFM. in the example of using an AFM, the electric field from the tip of the AFM may move a large number of nanoparticles concurrently in the scan direction of the AFM, thus creating relatively large periodic arrays of relatively uniformly spaced nanoparticles. By exercising planned and preferably computer driven control over the scan parameters (e.g., row and column dimensions, spacing between essentially pixel elements of deposition along the scan line, field intensity, etc.), the substrate can be intentionally patterned with the distribution of nanoparticle arrays.

Methods and devices described herein include, for example, a method of forming flash memory devices from nanoparticles by providing a source of conductive nanoparticles; providing a transistor base; providing a first electrically insulating layer over a surface of the transistor base to provide an electrically insulating surface distal from the transistor base; depositing the conductive nanoparticles to the surface of the transistor base in a first distribution of the nanoparticles; applying a field to the conductive nanoparticles on the surface of the transistor base that applies a force to the particles; rearranging the conductive nanoparticles on the surface of the transistor base by the force from the field to form a second distribution of conductive nanoparticles on the surface of the transistor that is more ordered or more patterned than the first distribution of conductive nanoparticles; and overlaying a second electrically insulating layer over the second distribution of conductive nanoparticles.

DETAILED DESCRIPTION OF THE INVENTION

Figure 1:
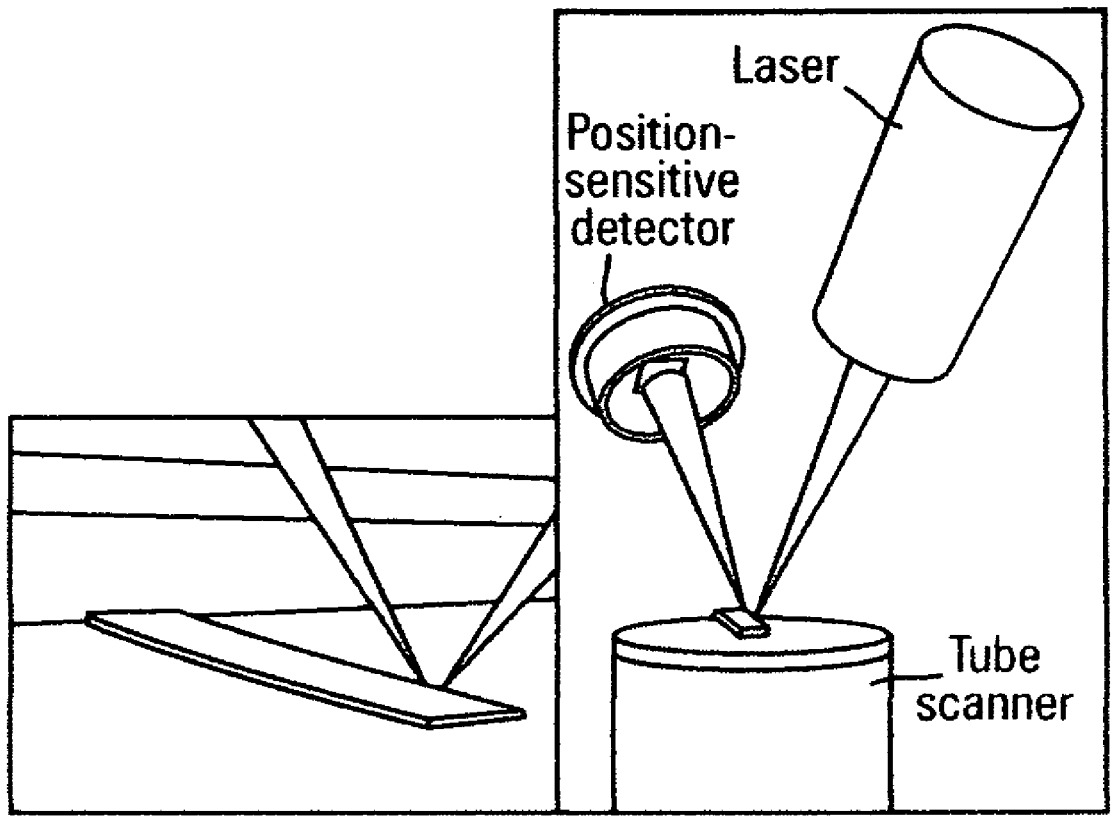
FIG. 1 shows a schematic of the concept of AFM and the optical lever: (left) a cantilever touching a sample; (right) the optical lever. Scale drawing; the tube scanner measures 24 mm in diameter, while the cantilever is 100 μm long.

Flash memory is a very important memory in the semiconductor industry. Flash memory have been broadly applied to replicatively access data but not disappear as power is lost, such as the film of digital camera or the basic input-output system of a mother board, because flash memory has the advantages of electrically erasable and programmable mechanisms. Accordingly, how to advance the performance and reduce the cost of the flash memory becomes an important subject.

In the conventional method for forming a flash memory cell, the isolation oxide is formed and then a planarization process is performed, such as a chemical mechanism polishing (CMP) process. In the process steps, the CMP process is difficult controlled and the common disadvantages is dishing or erosion on the surface. Hence, there are many solutions to overcome the disadvantages of the CMP process. Moreover, it is more and more important to integrate the processes and to increase the efficiency of the flash memory.

Referring to FIG. 1A (e.g., reference is made to US Patent Publication No. 20020066923), a common structure of a flash memory cell is a stacked structure which basically comprises a source 11, a drain 12, a floating gate 13, and a control gate 14. The source 11, the drain 12, and the control gate 14 are connected with different voltages to control the programming process, the reading process, and the erasing process of flash memory. The floating gate 13 and the control gate 14 are surrounded by a dielectric layer 15 on a substrate 10.

In respect to an N type flash memory cell (the substrate 10 is an N type substrate), the source is grounded, and the control gate 14 and the drain 12 are put a positive voltage in a programming mechanism. Because there is not using a light doped drain, so partial electrons will diffuse into the floating gate 13 and is trapped in the floating gate 13 due to the potential barrier of the surrounding dielectric layer 15. However, electrons in the floating gate 13 will affect the threshold voltage of the channel region between the source 11 and the drain 12, and control the conduction of the channel region. Then, electrons in the floating gate 13 can be reputed as data which is read by the conduction of the channel region. In an erasing mechanism, the source 11 is grounded, and the control gate 14 is put a positive voltage which is lower than the drain 12. Electrons in the floating gate 13 will disappear by Fowler-Nordheim tunneling.

Obviously, the performance of flash memory cell will be affected by the under erase (residual electrons in the floating gate 13) or the over erase (further bring positive charges 16 from the floating gate 13), as shown in FIG. 1B. For example, the over erase of flash memory causes not proceeding the accessing data because positive charges 16 in the floating gate 13 will result to charge neutrality or the change of the conduction of the channel region. Furthermore, the flash memory could not access any data if positive charges 16 in the floating gate 13 are so many to automatically conduct the channel region.

The most common type of non-volatile memory that is most widely used in mobile electronic devices is known as the Flash memory. Flash memory stores information in an array of floating gate transistors, each of which is known as a cell. The schematic diagram of a typical flash memory cell is shown in FIG. 1. While the actual memory device can be different from the structure shown in FIG. 1, a flash memory cell typically consists of a Source, a Drain, a Floating Gate and a Control Gate (also known as the Gate). The operation of a flash memory cell is briefly as follows. The threshold voltage of the transistor determines the amount of current that flows between the Source and the Drain for an applied voltage on the Control Gate. The threshold voltage in turn is determined by the amount of charge on the Floating Gate. A charge can be deposited on the Floating Gate by applying a voltage pulse to the Control Gate, whereby electrons tunnel through the Tunnel oxide and collect on the Floating Gate. This is how a 'one' or a 'zero' is stored in the cell. Since an insulating oxide layer surrounds the Floating Gate, any charge deposited on it remains stored on it for a very long time, giving rise to the non-volatile nature of flash memory. The charge from the Floating Gate can be removed (erase function) by applying a voltage pulse between the Source and the Control Gate, where by electrons tunnel out of the Floating gate through the tunnel oxide. One of the problems with flash memory is that the voltage pulses needed for write and erase operations are typically much larger than the power supply voltage, as a result of which charge-pump circuits are typically used on current memory chips to generate the high voltages.

Figure 2:
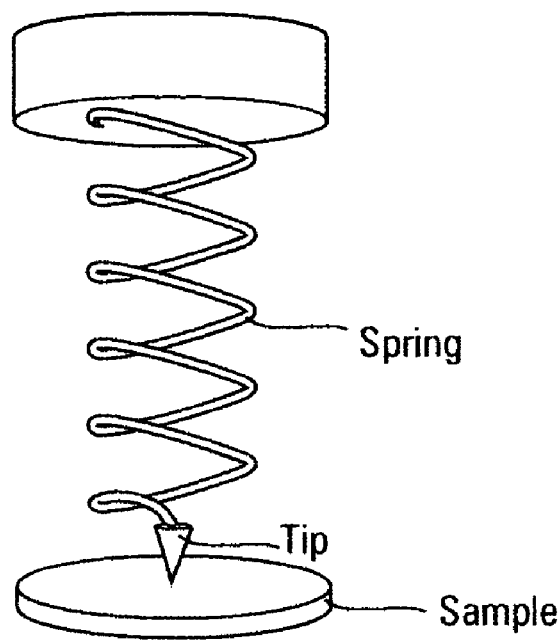
FIG. 2 shows a schematic illustration of the meaning of "spring constant" as applied to cantilevers. Visualizing the cantilever as a coil spring, its spring constant k directly affects the downward force exerted on the sample.

In flash memory chips, the Floating Gate is typically implemented using a continuous piece of semiconductor or metal. It has been proposed that if the Floating Gate is implemented using an array of nanoparticles instead of a continuous material, then it can provide many significant advantages such as (i) reduced cell size leading to increased memory density, (ii) reduced power consumption, (iii) elimination of charge pump circuits, (iv) improved reliability, (v) faster read/write times, etc. The above benefits arise primarily from single electron charging effects in nanoparticles. The schematic cross-sectional diagram of such a nanoparticle based flash memory cell is shown in FIG. 2. In fact, flash memory cells implemented using nanoparticle Floating gates have shown significant improved performances in the laboratory [1,2]. In such demonstrations, the nanoparticles were fabricated using electron-beam lithography technique, which unfortunately is not appropriate for volume commercial manufacturing.

While the benefits of flash memory with nanoparticle floating gates have been well appreciated, their commercial manufacturing has been limited by the unavailability of a suitable fabrication technique. A nanoparticle floating gate flash memory requires: (i) the formation of nanoparticles of metals or semiconductors, (ii) nanoparticle dimensions should be small, preferably in the 1 nm-10 nm range, (iii) deposition of an array of nanoparticles that are physically separated from each other, and (iv) nanoparticles with good size uniformity, preferably with less than 5-10% size variation. Photolithographic techniques are not suitable for the fabrication of such nanoparticles and electron-beam lithographic techniques are not appropriate for volume commercial manufacturing. To address this, a variety of nonlithographic techniques have been investigated for the formation of nanoparticles, however, most of them suffer from lack of engineering control over nanoparticle size, position and/or size distribution.

We have developed a process for the implementation of nanoparticle based floating gate flash memory that meets the above requirements and is also suitable for volume commercial manufacturing. The process is based on the deposition of nonlithographic nanoparticles of a particular dimension and with small size distribution in a high vacuum environment. The nanoparticles are deposited on top of the tunnel oxide using a voltage applied to the substrate. The small thickness of the tunnel oxide compared to the surrounding field oxide layers ensures that the nanoparticles are preferentially deposited in the tunnel oxide regions. The nanoparticles are then ordered using a proprietary ordering technique to prevent agglomeration. This is followed by the formation of the control oxide, subsequent to which the rest of the device is fabricated. The following section describes the implementation of the nanoparticle floating gate flash memory. Only the formation of the nanoparticle-floating gate is described here, the remaining parts of the memory cell can be implemented using established fabrication techniques.

Figure 3:
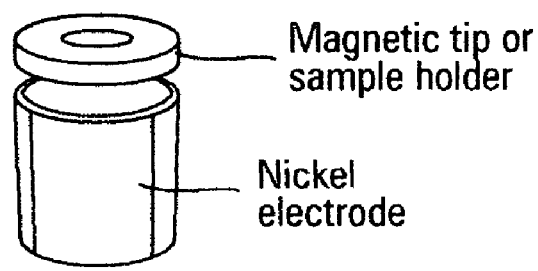
FIG. 3 shows a tip holder and nickel electrode useful in an AFM systems for material deposition.
Figure 4:
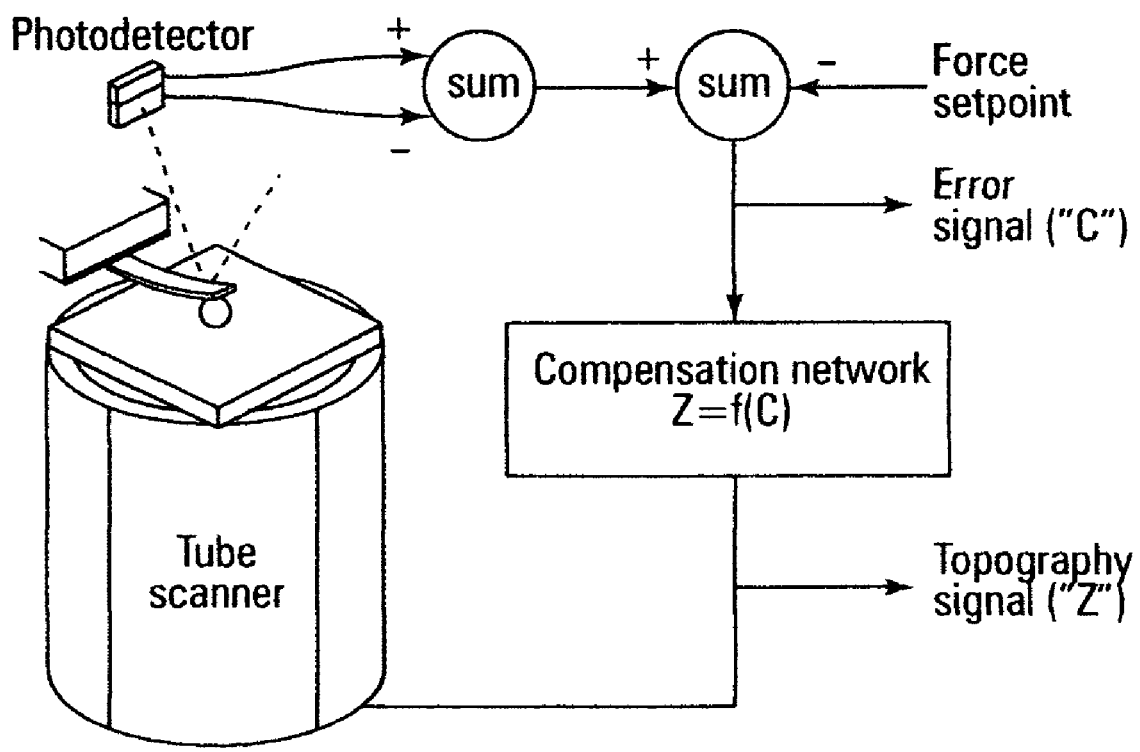
FIG. 4 shows an AFM feedback loop. A compensation network (which in my AFM is a computer program) monitors the cantilever deflection and keeps it constant by adjusting the height of the sample (or cantilever).

The flow diagram in FIG. 3 shows one procedure for the implementation of the nanoparticle floating gates for the flash memory chips. The silicon wafers are first cleaned using an established cleaning procedure. The field oxide, which separates the transistors on the chip, is grown next. Following this, the gate areas are patterned using a patterning technique and the field oxide etched from the gate areas. Next a thin layer of insulator, such as silicon dioxide, is deposited or grown to act as the tunnel oxide layer. While silicon dioxide is typically used as the tunnel oxide, other insulator materials can also be used for this purpose. Nanoparticles are next deposited in the gate areas. Nanoparticles of a variety of metals or semiconductors can be used for the flash memory devices. The preferential deposition of nanoparticles in the gate areas are achieved through the application of a bias voltage on the substrate. Since the nanoparticles arriving from the nanoparticle deposition tool are negatively charged, an application of a bias voltage on the substrate selectively attracts them to the gate regions due to the relatively smaller thickness of the gate oxides compared to the filed oxide. The deposited nanoparticles are next ordered using a proprietary ordering technique. Ordering of the nanoparticles prevents agglomeration of the nanoparticles, which is needed for improved device performance. However, if only a small number of nanoparticles are deposited, then ordering of the nanoparticles may not be necessary. Next, the control gate insulator layer is deposited. While silicon dioxide is typically used as the control gate insulator, other insulating materials can also be used. The control gate insulator can be formed by deposition or growth or by other techniques. In another approach, a small amount of reactive gas, such as oxygen, can be introduced into the chamber after the deposition of the nanoparticles. The reactive gas reacts with the surface of the nanoparticles forming a thin layer of insulator on the surface. Additional insulators can be deposited to obtain the desired thickness of control gate insulator. The fabrication of the control gate insulator is followed by the fabrication of other sections of the flash memory device to form the flash memory chip.

A very general and generic description of the technology described herein comprises a method, system and apparatus for forming structures from nanoparticles comprising: providing a source of nanoparticles that are catalysts or seeds to growth of a second material; depositing the nanoparticles to a first support surface in a first distribution of the nanoparticles; applying a field to the nanoparticles on the first support surface that applies a force to the particles; rearranging the nanoparticles on the first support surface by the force from the field to form a second distribution of nanoparticles on the first support surface that is more ordered or more patterned than the first distribution of nanoparticles; and growing a nanostructure from the second distribution of nanoparticles using the nanoparticles as seeds or catalyst for the growth. The field, for example, may be any force field that can assist in the ordered redistribution of particles on the surface, such as especially an electrical field or a magnetic field. Before growing a structure, the second distribution of nanoparticles on the surface may be fixed to the first support surface for growing particles on the first surface or transferred to a second support surface and the growing occurs on the second support surface. The nanostructure may be made of an elemental material or a compound. The method may be practiced on a surface that preferably may be a flat surface having less than 1% of the flat surface with vertical features greater than a number average diameter for the nanoparticles being deposited. The method preferably may have an operational vacuum of less than $10^{-5}$ Torr is maintained over the surface continuously while nanoparticles are being deposited and until the structure is grown.

The field may be applied to the deposited nanoparticles from a) a front side of the surface on which the particles are deposited without a field applicator contacting the front side of the surface, b) between the two substrates or c) from a back side of the surface on which the particles are deposited with a field applicator either contacting or not contacting the back side of the surface. The preferred nanostructure comprises a nanotube or circuitry structure. In addition to the field rearranging the particles, a biasing field opposed to the field rearranging the nanoparticles may be applied to provide control over influence of the field rearranging the nanoparticles.

One format for a system for forming structures from conductive nanoparticles comprises: a source of conductive nanoparticles that comprise a basis for forming an electrically conductive system over a transistor base as part of a flash memory unit or device; a surface of a transistor base for receiving a deposit of the conductive nanoparticles; a system for maintaining a vacuum over the surface while conductive nanoparticles are being deposited in a first distribution of the conductive nanoparticles; a field applicator that applies a field to the first distribution of the conductive nanoparticles on the surface, the field applicator applying a force to the conductive nanoparticles within the vacuum system to form a second distribution of the conductive nanoparticles; a deposition system within the vacuum system for providing a second electrically insulating layer over the second distribution of particles to cover, secure, encapsulate and/or fix the second distribution of nanoparticles to the first electrically insulating layer. The operational environment may—provide for a vacuum of less than $10^{-5}$ Torr to be maintained over the surface, the transfer zone and the growth system continuously while nanoparticles are being deposited and until the structure is partially completed (e.g., before deposition of a metal layer completing gate) or completed (after deposition of the metal layer).

The present technology relates to a novel tool, system and process to create large quantity of patterned and ordered nanoparticles with excellent size control onto an electrically insulating surface over a transistor and further applying at least another electrically insulating layer over the ordered nanoparticles to create a flash memory. Additionally layers can be provided to form a floating gate or other structures and functions supplemental to or modifying of the underlying flash memory device.

The technology described herein includes various methods, systems and structure embodying generic concepts described and enabled herein. Among those generic concepts are a method of forming flash memory devices from nanoparticles. The method may include providing a source of conductive nanoparticles and providing a transistor base. A first electrically insulating layer is provide over a surface of the transistor base to provide an electrically insulating surface distal from the transistor base. Any electrically insulating layer such as those known in the flash memory technology, chip technology, electrical component technology and the like may be used for this layer. Ceramics, inorganic oxides, and especially silica (SiO2 and blends or mixtures with silica are among the more common electrically insulating layers and are deposited by methods and techniques well understood in the art such as chemical deposition, electrical deposition, vapor deposition, sputtering and the like. The conductive nanoparticles are deposited onto the surface of the transistor base in a first distribution of the nanoparticles. The deposition is usually provided with electrical or tribolectrical charging of the surface and/or the nanoparticles. A field is applied to the conductive nanoparticles on the surface of the transistor base that applies a force to the particles. The conductive nanoparticles are rearranged on the surface of the transistor base by the force from the field to form a second distribution of conductive nanoparticles on the surface of the transistor that is more ordered or more patterned than the first distribution of conductive nanoparticles. It is possible that a designed field and forces on the transistor surface I (the electrically insulating layer on the transistor base) such that particles are initially applied in an ordered pattern, as in electrophotographic deposition of particles, and this I considered equivalent to first distribution and then rearranging, although the latter is preferred. A second electrically insulating layer is overlaid over the second distribution of conductive nanoparticles by known electrically insulating layer deposition techniques, such as those described above for the first electrically insulating layer. Similar materials may be used for the second electrically insulating layers as for the first electrically insulating layers. The field, by way of non-limiting examples may be an electrical field or a magnetic field. The method may continue with providing a metal layer over the second electrically insulating layer to form a gate as part of a floating gate unit. The method may use nanoparticles of any shape (with some reasonable degree of uniformity in size and shape desired, although not functionally required). It is preferable that the nanoparticles have a standard weight average and/or size average (size of its number average diameter, for example) deviation of less than 50%, less than 40%, less than 25%, less than 15% or less than 10% (and even less than 5%) to simplify and optimize the process and the product. It is preferred that the nanoparticles tends towards symmetrical shapes and have arcuate, rounded or spherical surfaces and avoid flat surfaces that extend more than 50% of the average nanoparticle diameter, especially on any surfaces that contact the first electrically insulating layers. Most preferably the nanoparticles comprise spheres of conductive materials such as metal that are known to be used in layers of flash memory systems as conductive layers in the known art. The method may desire that the surface of the first electrically conductive layer distal from the transistor base is a flat surface having less than less than 5% or less than 1% of the flat surface with vertical features greater than a number average diameter for the nanoparticles being deposited. The method may be practiced within a vacuum of less than $10^{-5}$ Torr is maintained over the surface of the transistor base continuously while the conductive nanoparticles are being deposited and until the second electrically insulating layer is provided. A discontinuous layer may be formed by the conductive nanoparticles, and the discontinuous layer has a projected coverage of between 10% and 67% of a projected area. The discontinuous layer may me a monoparticulate layer thickness or may comprise multiple nanoparticulate thickness, forming a porous stacking of particles. The field may be applied to the deposited nanoparticles from a) a front side of the surface of the transistor base on which the particles are deposited without a field applicator contacting the front side of the surface of the transistor base or b) from a back side of the surface of the transistor base on which the particles are deposited with a field applicator either contacting or not contacting the back side of the transistor base. The method is particularly conveniently practiced by forming recesses in the transistor base and the first electrically insulating layer being formed at least within the recesses before depositing the conductive nanoparticles. Recesses may be formed by mechanical means (e.g., drilling or grinding or molding), chemical etching means (e.g., photolithographic etching, photoresist etching, mask etching and the like), electromagnetic etching (e.g., laser etching, laser ablation) and the like. The base of the recess is preferably flat, and preferably smooth to assure uniformity to the electrical process that occurs in use of flash memories. The method may be practiced wherein in addition to the field rearranging the particles, a biasing field opposed to the field rearranging the nanoparticles is applied to provide control over influence of the field rearranging the nanoparticles.

The method preferably uses conductive particles of spherical metal nanoparticles. The metal of the metal spherical particles may be the same as or a different metal from the metal of the metal conductive layer over the second electrically insulating layer. The recesses should be formed in the transistor base and the first electrically insulating layer is formed at least within the recesses before depositing the conductive nanoparticles. A discontinuous layer is generally formed by the conductive nanoparticles, even if they are sintered to form a porous layer and the discontinuous layer has a projected coverage of between 10% and 67% of a projected area. By "projected coverage" it is meant that viewing the nanoparticle layer along perpendicular lines of sight, between 10% and 67 may appear as voids, especially in a monoparticle layer. In less preferably patterned or distributed monoparticle nanoparticle layers, there may be greater surface area coverage (e.g., greater than 67%, such as 75%, 85%, 90% or more) and in multiparticle layer thickness nanoparticle layers there may even be 100% coverage of a projected area or projected coverage, sporadically or uniformly across the surface. Essentially monoparticle surface coverage is preferred.

A flash memory device according to the present generic description could have a transistor base, a first electrically insulating layer, a layer of conductive nanoparticles, the conductive nanoparticles having a side of the conductive nanoparticles in contact with the first electrically insulating layer; and a second electrically insulating layer covering the conductive nanoparticle layer. The side of the conductive nanoparticles in contact with the first electrically insulating layer should be a non-flat side of the conductive nanoparticles, as described above with respect to the process. For example, the non-flat side of the conductive particles may be arcuate, rounded or spherical. The device may also have a metal conductive layer over the second electrically insulating layer, such as that used in forming a floating gate. The conductive nanoparticles preferably are metal nanoparticles.

Nanoparticles with preferably better than 10% or 5% size uniformity (e.g., less than ±5% standard deviation among number average particle distribution, such as measured by average particle diameters) can be provided by any available source, such as by being created using an ultra-high vacuum nonlithographic technique. A preferred method is based on atomic cluster formation from atoms or small clusters of atoms, such as those formed by vaporization or plasma techniques such as sputtered atoms. The particle or atom or molecule or cluster formation is then followed by mass filtering (or any other sizing technique) as needed, to provide the uniformity of nanoparticle sizes desired in the practice of the technology. The charged nanoparticles thus formed are then deposited onto a temporary or intermediate surface in a relatively random pattern. The random pattern of deposited particles (which are not permanently fixed to the temporary surface are then ordered and patterned using controlled field scanning. For electrically charged deposited nanoparticles, the use of an atomic force microscope (AFM) tip is one of the available ways of providing a field (an electrical field in this instance) that can pattern or order the particles. The electric field from the tip moves a large number of nanoparticles concurrently in the scan direction thus creating very large periodic arrays of uniformly spaced nanoparticles. Although not limited to this theory, it is believed that this method, as well as other field induced distribution methods operates by creating charges or fields in the particles that naturally repel similar charges or fields in adjacent particles (e.g., negative charges repel negative charges, N-magnetic poles repel N-magnetic poles). The combination of repelling forces assist in the even distribution of particles based on the even distribution of forces among the adjacent particles. Controlling the scan parameters controls the nanoparticle array charge and field properties. In one format of practicing this technology, an AFM tip scanning technique can be combined with application of additional voltages to the substrate to pattern the nanoparticle arrays. A major strength of this technique is its compatibility with silicon CMOS technology thus making it suitable for volume manufacturing. Also, the high quality ordered and patterned nanoparticles can be created on any substrate including silicon, ceramics, composites, glass and plastic (e.g., insulating or non-conductive surfaces of any type). As an alternative to AFM scanning, large array field application (e.g., a 2-dimensional large area array of field generators) can be practiced or a line array can be scanned across a surface (e.g., a one dimensional line of field generators can be swept across the surface with random particles).

One type of practice of the present underlying technology for the distribution of the metal particles onto the insulating coating over the transistor base relies upon a novel combination of apparatus used in a novel combination of steps, even though individual components of the apparatus and individual steps may separately known in other applications and uses. This one type of practice may include at least:

a) providing a source of relatively uniform nanoparticles (e.g., less than 20 nm, or less than 15 nm, or less than 10 nm or less than 5 nm particles with a standard size deviation of less than ±100%, ±50%, or ±25% or less as described elsewhere herein by number average of particles;

b) providing those particles with a capability of being moved by application of a field, especially an electromagnetic field (e.g., an electrical field or magnetic field), if the particles are not innately capable of being moved by a field (e.g., are magnetic rather than merely magnetically susceptible);

c) providing the field movable particles onto a substrate; and d) rearranging the field movable particles on the substrate by applying a force or field to the particles on the surface to rearrange the particles on the surface.

The particles may be provided by any of the many variations of products and sources for nanoparticles, and may be filtered by mechanical, magnetic, resistive flow, or electrostatic means, or manufactured by any process that provides the particles in the size an distribution range desired for the process or selected for the specific ultimate use intended for the process or the resulting nanoparticle coated surface or final article. Any filtering technique that provides a useful size distribution of nanoparticles may also be used. The standard deviation indicated is designed for more precise applications and is not intended as a functional limitation on the general practice of the present technology. In some applications larger particles (generally requiring stronger field effects to move and locate the particles) may well be desirable, while in other cases, narrower size distributions and smaller size particles may be necessary. General ranges might be, for example, average size particles of from 2-15 nanometers (number average diameter), average size 3-18 nanometers (size average distribution), average size particles of 2-20 nanometers (size or number average distribution), 2-10 nanometers, 2-5 nanometers, or 1-5 nanometers, with standard deviations of ±75%, ±50%, ±40%, 30%, 25%, 20%, 15%, 12%, 10%, 8%, 5%, or less.

The application of the force to rearrange particles usually is best applied without contact of the force applicator with the particles themselves or the side of the substrate carrying the particles (referred to herein as the "front side"). Thus, an electrical force can be applied from the front side by any format of field applicator, such as a non-contact Atomic Force Microscope or other precision stylus application system. Similarly a magnetic force can be applied by non-contact front side application of the field from a native magnetic stylus or pulsed electromagnetic stylus or tip. Typically, if the particles are charged (e.g., negative charge or positive charge), a like charge will be applied over the front side to assist in rearranging the particles. If an opposite charge were used from the front side, particles would tend to be lifted from the surface rather than be rearranged. If a stronger opposite field or charge is applied from the back side of the substrate or from within the substrate, an opposite charge (from that on the particles) may be applied from the front side without significant lifting of particles.

The force application may also be applied to the back side of the substrate with a controlled strength similar charge or opposite charge, and the force applicator may now contact the rear side of the support surface without concern for physical rearrangement of the nanoparticles by the force applicator. If a charge opposite that of the charge on the particles is used, no additional biasing charge would be required (although it might be used for better control and precision of field and particle distribution). If a same charge or field (magnetic field, North-South orientation of field) is used for the back side field application as the charge (or field) on the nanoparticles, a biasing force facing the front side of the support surface may be used to prevent particles from being repelled from the support surface. For example, the biasing front side field may be at least about 5% or 10% (or greater) stronger than the rear side field applied to the field susceptible particles. Stronger in this sense does not necessarily mean absolute strength at the point of emission or generation of the field, but rather the strength as it affects the movement of particles. For example, in relative non-unit terms, the biasing field may be 100 absolute units where generated and the backside field strength may be 120 absolute units. However, because of the proximity and medium through which the front side field is applied (e.g., a high vacuum, medium vacuum, low vacuum or other pressure, and the particular gaseous medium used (e.g., an inert gas, noble gas, non-reactive gas, etc.), the actual effective front side field strength may be 80 units, while the insulating or field shielding effect of the back side application may reduce the effective back side field strength from 120 units to 60 units, thus maintaining the particles on the support surface while the particles are being rearranged by the field(s) applied.

Where the particles are potentially reactive with various gases (e.g., oxygen, halogens, hydrogen, and the like) or other materials that may be in the particle application or particle rearranging environment, the particles should be protected against reaction, unless a reaction is desired (e.g., depositing aluminum nanoparticles in an oxidizing environment so that oxidized aluminum (e.g., alumina) nanoparticles are formed before, during or after deposition. The best method of protecting the particles is under vacuum conditions such as at about $10^{-10}$ Torr, or at least between about $10^{-5}$ Torr and $10^{-11}$ Torr.

A presently preferred range of particle sizes (e.g., non-agglomerated particles average size or agglomerated particles average size) is between 1 and 20 nanometers, 1-15 nanometers, 2-20 nanometers, 2-15 nanometers, 2-10 nanometers, 5-15 nanometers and 5-10 nanometers, depending upon the particles process used, the particular article intended and the strength of the field(s) used.

The process of rearranging the particles is generally referred to as patterning of the particles, as the original deposition of particles tends to be random, if not completely random. Of note, when the particles are deposited on the surface, even though it is a relatively smooth surface (as with commercial grade silicon wafers), there is some topography on the support surface, such as rills, mounds, waves, modulations, random topographic events and the like. Particles when deposited on the surface may naturally seek to orient themselves along such topographic anomalies, and this is not considered a pattern or intended arrangement. Even with this incidental alignment of particles with the topography, after application of the field (by smooth field application, field array application, pulsed application, or the like), the particles tend to orient themselves in the applied field pattern and overcome the incidental tendency to align with topographic features. This can readily be seen with photomicroscopic views (e.g., scanning electron microscope images) of the randomly deposited particles and the patterned particles after application of the field.

Creation of ordered and patterned nanoparticles with high purity and good size control is a prerequisite for many device applications. The present technology opens the door for many commercial applications in biomedical, optical and electronic devices. Light emitting devices, sensors, single electron transistors and biomolecular tagging are only a small sample of potential applications.

The atomic force microscope (AFM) is a very high-resolution type of scanning probe microscope. The AFM was invented by Binnig, Quate and Gerber in 1985, and is one of the foremost tools for the manipulation of matter at the nanoscale.

The AFM consists of a cantilever (probe) with a sharp tip at its end that is used to scan the specimen surface. The probe is typically silicon or silicon nitride with a tip radius of curvature on the order of nanometers. When the tip is brought into close proximity of a sample surface, the Van der Waals force between the tip and the sample leads to a deflection of the cantilever according to Hooke's law. Typically, the deflection is measured using a laser spot reflected from the top of the cantilever into an array of photodiodes. However a laser detection system can be expensive and bulky; an alternative method in determining cantilever deflection is by using piezoresistive AFM probes. These probes are fabricated with piezoresistive elements that act as a strain gage. Using a Wheatstone bridge, strain in the AFM probe due to deflection can be measured, but this method is not as sensitive as laser deflection.

If the tip were scanned at a constant height, there would be a risk that the tip would collide with the surface, causing damage. Hence, in most cases a feedback mechanism is employed to adjust the tip-to-sample distance to maintain a constant force between the tip and the sample. Generally, the sample is mounted on a piezoelectric tube, that can move the sample in the z direction for maintaining a constant force, and the x and y directions for scanning the sample. The resulting map of s(x,y) represents the topography of the sample. However, with substrate surfaces that are 'flat' with respect to the possible variations in the up-and-down movement of the AFM tip, minimal to no feedback may be necessary.

Over the years additional modes of operation have been developed for the AFM. The primary modes of operation are contact mode, non-contact mode, and dynamic contact mode. In the contact mode operation, the force between the tip and the surface is kept constant during scanning by maintaining a constant deflection. In the non-contact mode, the cantilever is externally oscillated at or close to its resonance frequency. The oscillation is modified by the tip-sample interaction forces; these changes in oscillation with respect to the external reference oscillation provide information about the sample's characteristics. Because most samples develop a liquid meniscus layer, keeping the probe tip close enough to the sample for these inter-atomic forces to become detectable while preventing the tip from sticking to the surface presents a major hurdle for non-contact mode in ambient conditions. In dynamic contact mode, the cantilever is oscillated such that it comes in contact with the sample with each cycle, and then enough force is applied to detach the tip from the sample.

Schemes for non-contact and dynamic contact mode operation include frequency modulation and the more common amplitude modulation. In frequency modulation, changes in the oscillation frequency provide information about a sample's characteristics. In amplitude modulation (better known as intermittent contact, semi-contact, or tapping mode), changes in the oscillation amplitude yield topographic information about the sample. Additionally, changes in the phase of oscillation under tapping mode can be used to discriminate between different types of materials on the surface.

The AFM has several advantages over the scanning electron microscope (SEM). The AFM can produce images of materials as small as 1 nm, while the SEM is limited to around 100 nm. Unlike the electron microscope which provides a two-dimensional projection or a two-dimensional image of a sample, the AFM provides a true three-dimensional surface profile. Additionally, samples viewed by AFM do not require any special treatments (such as metal coatings) that would irreversibly change or damage the sample. While an electron microscope needs an expensive vacuum environment for proper operation, most AFM modes can work perfectly well in ambient air or even a liquid environment.

The AFM tends to image a maximum height on the order of micrometres and a maximum total scanning area of around 150 by 150 micrometres. At high resolution, the quality of an image is limited by the radius of curvature of the probe tip, and so the selection of appropriate dimensions on the tip for the required resolution is an important selection or design parameter in the operation of specific assembly processes, even though any commercial tip can be used for manufacture where less resolution or perfection of deposition is needed.

The atomic force microscope is one of about two dozen types of scanned-proximity probe microscopes. All of these microscopes work by measuring a local property—such as height, optical absorption, or magnetism—with a probe or "tip" placed very close to the sample. The small probe-sample separation (on the order of the instrument's resolution) makes it possible to take measurements over a small area. To acquire an image the microscope raster-scans the probe over the sample while measuring the local property in question. The resulting image resembles an image on a television screen in that both consist of many rows or lines of information placed one above the other. Unlike traditional microscopes, scanned-probe systems do not use lenses, so the size of the probe rather than diffraction effects generally limit their resolution.

AFM (FIG. 1) operates by measuring attractive or repulsive forces between a tip and the sample. In its repulsive "contact" mode, the instrument lightly touches a tip at the end of a leaf spring or "cantilever" to the sample. As a raster-scan drags the tip over the sample, some sort of detection apparatus measures the vertical deflection of the cantilever, which indicates the local sample height. Thus, in contact mode the AFM measures hard-sphere repulsion forces between the tip and sample.

In non-contact mode, the AFM derives topographic images from measurements of attractive forces; the tip does not touch the sample. AFMs can achieve a resolution of 10 µm, and unlike electron microscopes, can image samples in air and under liquids. In principle, AFM resembles the record player as well as the stylus profilometer. However, AFM incorporates a number of refinements that enable it to achieve atomic-scale resolution:

Sensitive detection
Flexible cantilevers
Sharp tips
High-resolution tip-sample positioning
Force feedback AFMs can generally measure the vertical deflection of the cantilever with picometer resolution. To achieve this, most AFMs use the optical lever, a device that achieves resolution comparable to an interferometer while remaining inexpensive and easy to use.

The optical lever (FIG. 1) operates by reflecting a laser beam off the cantilever. Angular deflection of the cantilever causes a twofold larger angular deflection of the laser beam. The reflected laser beam strikes a position-sensitive photodetector consisting of two side-by-side photodiodes. The difference between the two photodiode signals indicates the position of the laser spot on the detector and thus the angular deflection of the cantilever.

Because the cantilever-to-detector distance generally measures thousands of times the length of the cantilever, the optical lever greatly magnifies motions of the tip. Because of this ~2000-fold magnification optical lever detection can theoretically obtain a noise level of about $10^{-14}$ m/Hz$^{1/2}$. For measuring cantilever deflection, to date only the relatively cumbersome techniques of interferometry and tunneling detection have approached this value.

A high flexibility stylus exerts lower downward forces on the sample, resulting in less distortion and damage while scanning. For this reason AFM cantilevers generally have spring constants of about 0.1 N/m (FIG. 2).

It would take a very long time to image a surface by dragging the coiled cantilever system over the surface (in the configuration of FIG. 2), because the coiled system cannot respond quickly as it passes over features. That is, it has a low resonant frequency, but an AFM cantilever should have a high resonant frequency.

The equation for the resonant frequency of a spring:

$$\text{resonant frequency} = \frac{1}{2\pi}\sqrt{\frac{\text{spring constant}}{\text{mass}}}$$

shows that a cantilever can have both low spring constant and high resonant frequency if it has a small mass. Therefore AFM cantilevers tend to be very small. Commercial vendors manufacture almost all AFM cantilevers by microlithography processes similar to those used to make computer chips. The cantilevers in FIG. 3 and FIGS. 4a, 4b and 4c measure 100 µm in length and consist of silicon oxynitride with a thin coating of gold for reflectivity. Most users purchase AFM cantilevers with their attached tips from commercial vendors, who manufacture the tips with a variety of microlithographic techniques.

A close enough inspection of any AFM tip reveals that it is rounded off. Therefore force microscopists generally evaluate tips by determining their "end radius." In combination with tip-sample interaction effects, this end radius generally limits the resolution of AFM. As such, the development of sharper tips is currently a major concern. Force microscopists generally use one of three types of tip. The "normal tip" (FIG. 4a) is a 3 µm tall pyramid with ~30 nm end radius. The electron-beam-deposited (EBD) tip or "supertip" (FIG. 4b) improves on this with an electron-beam-induced deposit of carbonaceous material made by pointing a normal tip straight into the electron beam of a scanning electron microscope. Especially if the user first contaminates the cantilever with paraffin oil, a supertip will form upon stopping the raster of the electron beam at the apex of the tip for several minutes. The supertip offers a higher aspect ratio (it is long and thin, good for probing pits and crevices) and sometimes a better end radius than the normal tip. Finally, Park Scientific Instruments offers the "Ultralever" (FIG. 4c), based on an improved microlithography process. Ultralevers offers a moderately high aspect ratio and on occasion a ~10 nm end radius.

Piezoelectric ceramics are a class of materials that expand or contract when in the presence of a voltage gradient or, conversely, create a voltage gradient when forced to expand or contract. Piezoceramics make it possible to create three-dimensional positioning devices of arbitrarily high precision. Most scanned-probe microscopes use tube-shaped piezoceramics because they combine a simple one-piece construction with high stability and large scan range. Four electrodes cover the outer surface of the tube, while a single electrode covers the inner surface. Application of voltages to one or more of the electrodes causes the tube to bend or stretch, moving the sample in three dimensions (FIG. 5).

Figure 5:
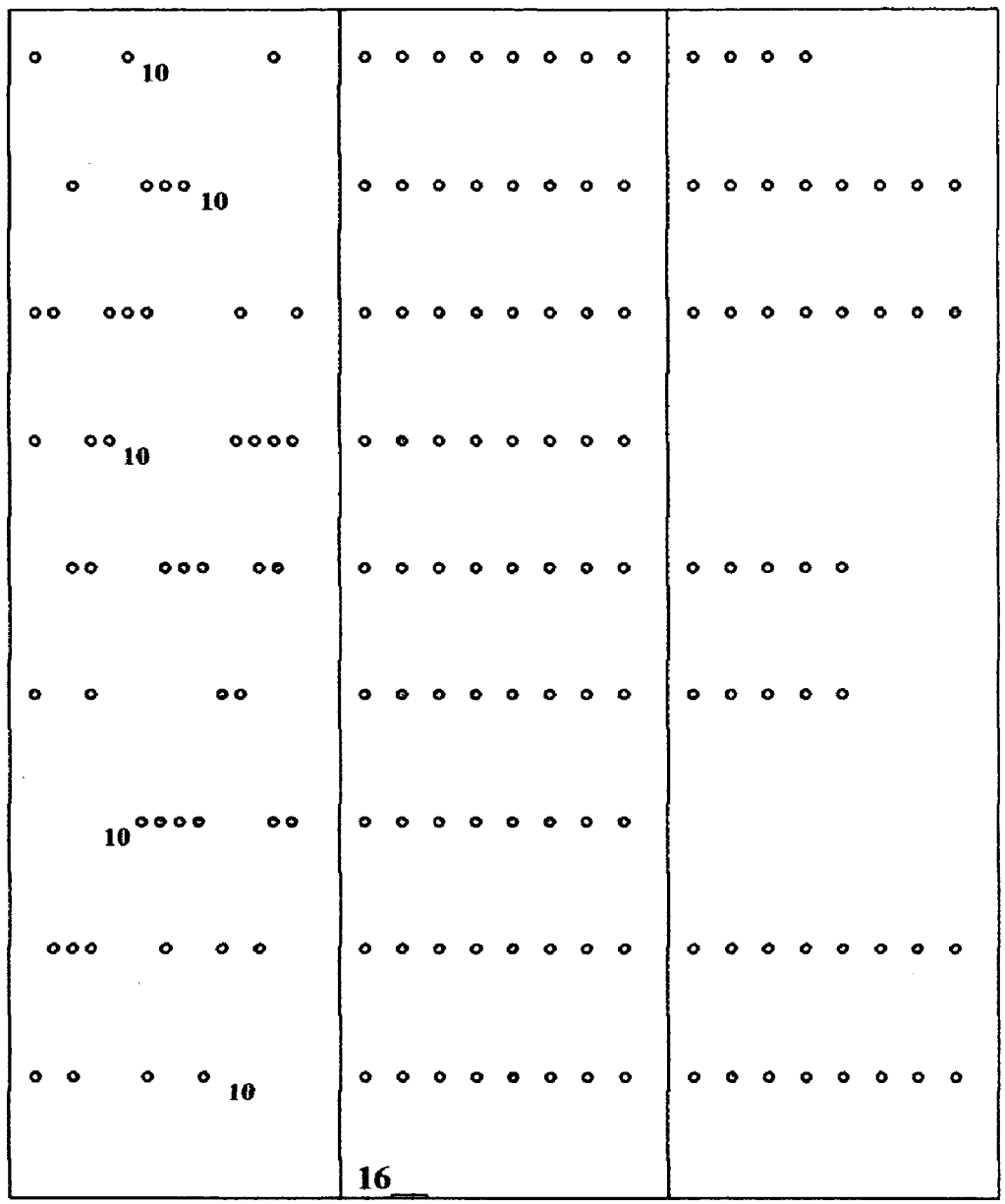
FIG. 5 shows a substrate 2 with three different zones illustrated thereon. Each zone has nanoparticles in different states of orientation.

AFMs use feedback to regulate the force on the sample as illustrated in FIG. 5. The presence of a feedback loop is one of the subtler differences between AFMs and older stylus-based instruments such as record players and stylus profilometers. The AFM not only measures the force on the sample but also regulates it, allowing acquisition of images at very low forces.

The feedback loop (FIG. 5) consists of the tube scanner that controls the height of the entire sample; the cantilever and optical lever, which measures the local height of the sample; and a feedback circuit that attempts to keep the cantilever deflection constant by adjusting the voltage applied to the scanner.

Figure 6:
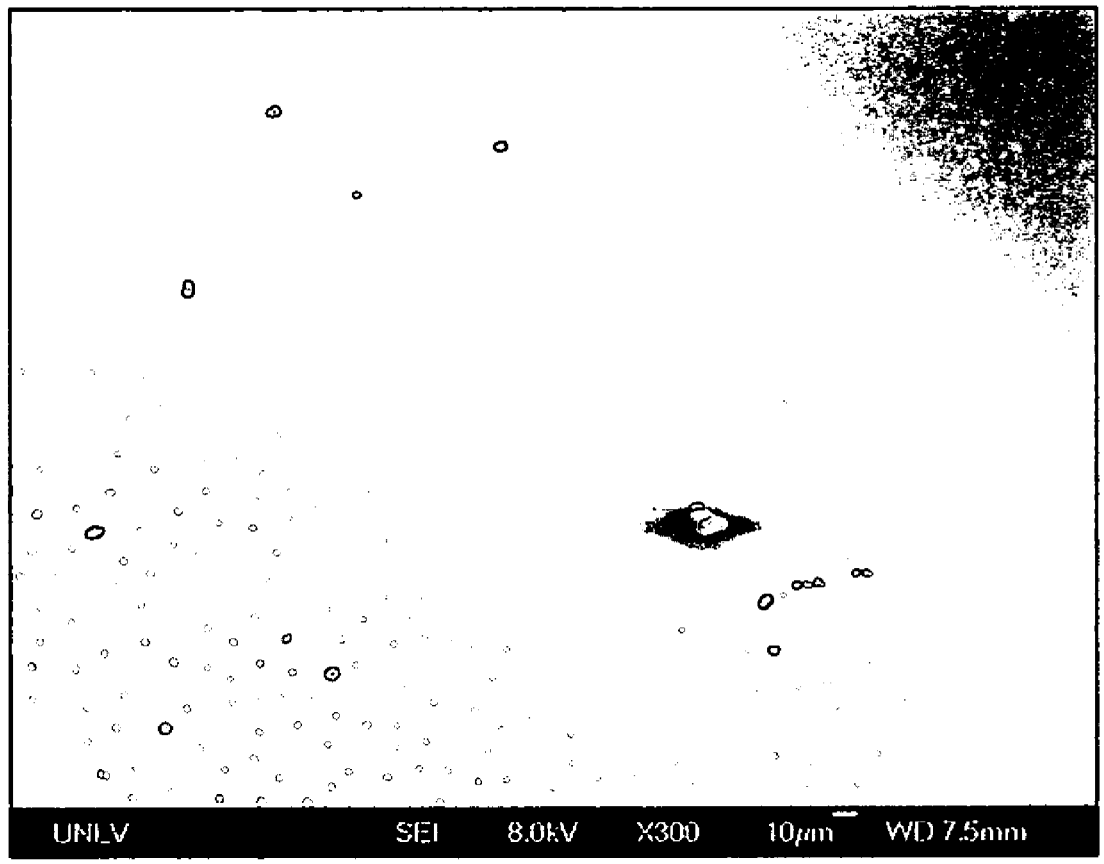
FIG. 6 is an electron photomicrograph image of nanoparticles distributed across a surface with one anomalous agglomeration of a large particle thereon.
Figure 7:
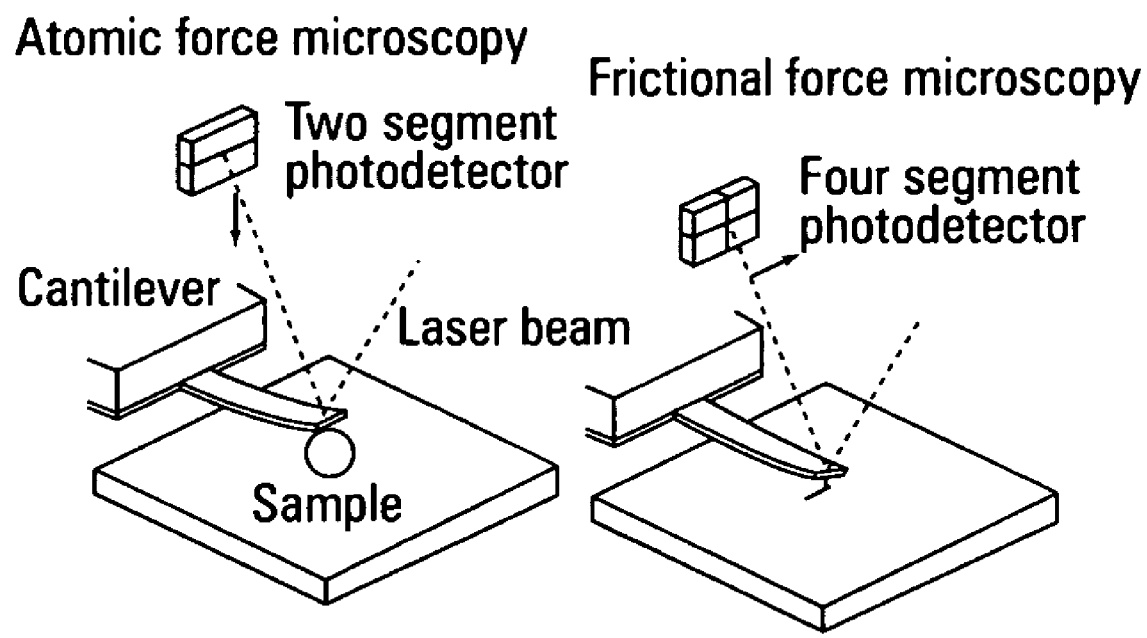
FIG. 7 shows a comparison between atomic force microscopy and friction force microscopy.
Figure 8:
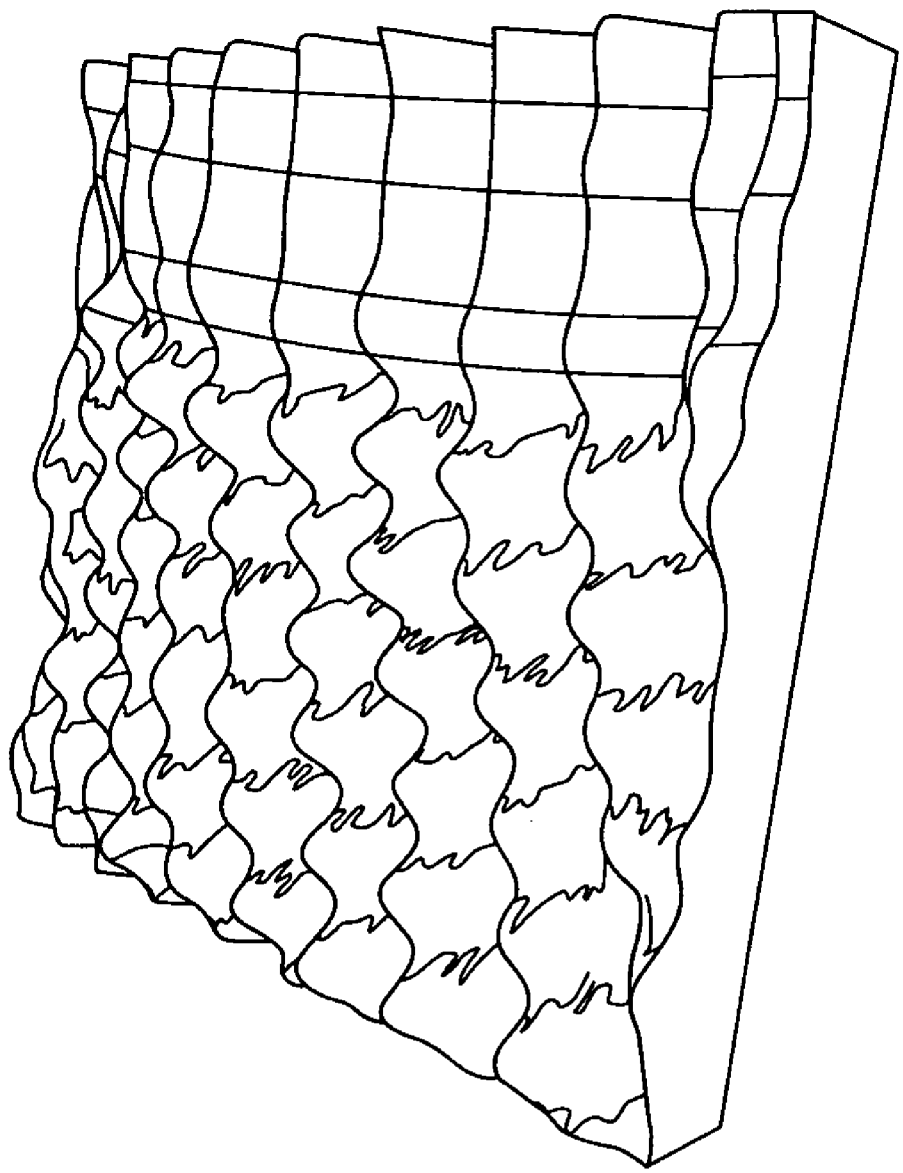
FIG. 8 shows a 2.5×2.5 nm simultaneous topographic and friction image of highly oriented pyrolytic graphic (HOPG). The bumps represent the topographic atomic corrugation, while the coloring reflects the lateral forces on the tip. The scan direction was right to left.

One point of interest: the faster the feedback loop can correct deviations of the cantilever deflection, the faster the AFM can acquire images; therefore, a well-constructed feedback loop is essential to microscope performance. AFM feedback loops tend to have a bandwidth of about 10 kHz, resulting in image acquisition times of about one minute. Almost all AFMs can measure sample topography in two ways: by recording the feedback output ("Z") or the cantilever deflection ("error"; see FIG. 6). The sum of these two signals always yields the actual topography, but given a well-adjusted feedback loop, the error signal should be negligible. As described below, AFMs may have alternative imaging modes in addition to these standard modes.

Optical lever AFMs can measure the friction between tip and sample. If the scanner moves the sample perpendicular to the long axis of the cantilever (FIG. 6), friction between the tip and sample causes the cantilever to twist. A photodetector position-sensitive in two dimensions can distinguish the resulting left-and-right motion of the reflected laser beam from the up-and-down motion caused by topographic variations.

Therefore, AFMs can measure tip-sample friction while imaging sample topography. Besides serving as an indicator of sample properties, friction (or "lateral force," or "lateral deflection") measurements provide valuable information about the tip-sample interaction.

Other types of materials and subprocess components and steps can include doped regions, such as n+ regions doped into a p-type substrate to form an NFET transistor element (not shown). These diffusion regions can be formed using n+ doped amorphous silicon, followed by rapid thermal anneal to limit thermal budget and subsequent silicidation. Similarly, for a PFET transistor element (not show), p+ diffusion source/drain regions could be formed over an n-well region. The source/drain regions and substrate of the present invention are not limited to any one conductivity type or formation technique.

A gate oxide insulator for the logic FET may be formed over the substrate and substantially between the source/drain regions. The gate insulator may be comprised of an ultra-thin silicon dioxide ($SiO_2$), silicon nitride (SiN), or silicon oxynitride (SiON) layer with a relative dielectric constant (K) in the range of 5.0-7.5. The SiON layer has the added benefit of low leakage for longer charge retention. Other possibilities include a combination of one or more monolayers of $SiO_2$ followed by an ultra-thin layer of high-k laminate such as $Pr_2O_3$ or PrSiON. This limits the gate insulation leakage current to the desired level.

A gate insulator can be formed on the substrate by atomic layer deposition (ALD). In one embodiment, the gate insulator can have a total physical thickness in the range of 2-2.5 nm for a power supply voltage of $V_{DD}$=1.0V. This thickness can be appropriately scaled for lower power supply voltage generation. This provides an equivalent oxide thickness (EOT) of 1.0-1.5 nm. An ultra-thin layer (e.g., 1-2 nm) of conductive metal nitride may be formed over the gate oxide insulator. This layer can be tantalum nitride (TaN), titanium nitride (TiN) or some other metal nitride material. This layer acts as an appropriate passivation layer and diffusion barrier for undesirable impurities and dopants.

A gate layer may be then formed over the passivation layer. The gate layer can be comprised of a doped polysilicon or metal material. In one embodiment, the polysilicon is an n+ conductivity material that is formed by using phosphorus doped amorphous silicon followed by RTA anneal and silicidation (e.g., nickel silicidation for both gate and diffusion). In an alternate embodiment, plasma chemical vapor deposition (CVD) or some other low temperature processing of borosilicate glass (for boron impurity) and phoso-silicate glass (for phosphorous impurity) might be employed for dopant sources.

In a silicon gate, a final RTA anneal step can be employed for dopant activation, interface state density control, leakage control, and film stability for the gate stack. A top layer of metal silicide, such as nickel silicide, may be formed over the silicon gate.

For metal gate processing, an appropriate ALD process can be employed. In one embodiment, this processing can include a layer of ALD Tungsten or Nickel combined with tungsten-silicide or nickel-silicide respectively.

Figure 9:
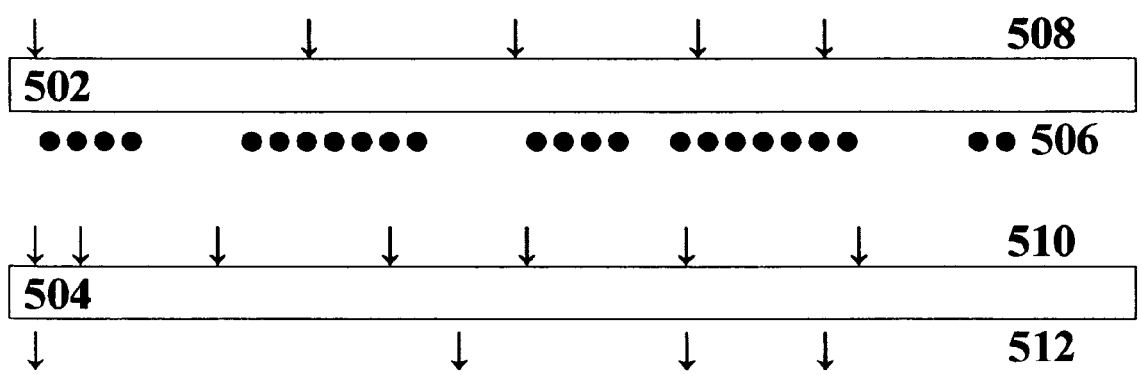
FIG. 9 shows a schematic of transfer of a patterned set of nanoparticles from a first substrate on which the particles were formed to a final or intermediate receptor substrate.

FIG. 9 shows a substrate 2 with three different zones 4, 6 and 8 illustrated thereon. Each zone has nanoparticles 10 in different states of orientation. Zone 4 shows a representation of nanoparticles 10 in which the nanoparticles 10 have been randomly deposited. Zone 6 shows an area where the nanoparticles 10 have been repeatedly scanned by a field (e.g., an AFM) along scan direction 16 to provide an ordered array of nanoparticles 10. Zone 8 is a representation of an area where a particular and directed distribution of the field has been applied to position nanoparticles 10 in oriented positions to define specific distribution of nanoparticles 10. A field applicator 12 is shown, with a tip 14 that precisely directs the field close to the substrate 2.

The general technology described herein enables and describes both methods, apparatus and systems of forming structures from nanoparticles. A general method according to the present technology may comprise:

providing a source of nanoparticles (e.g., metal, metalloid, atomic, molecular, charged, magnetic, inorganic, organic, etc.), the particles being capable of being moved by application of a field, such as an electrical field, magnetic field and even electromagnetic radiation or fields such as light, UV, IR, radiowaves, radiation and the like;

depositing the nanoparticles to a surface in a first distribution of the nanoparticles;

applying a field to the nanoparticles on the surface that applies a force to the particles;

rearranging the nanoparticles on the surface by the force from the field to form a second distribution of nanoparticles on the surface. The second distribution of nanoparticles is more ordered or more patterned than the first distribution of nanoparticles as a result of the rearranging. The ordering phenomenon is not fully understood, but one explanation or hypothesis for the electrical field forces is that (for example with negatively charged particles applied to the nanoparticles deposited on the surface) the first application of particles is fairly randomly deposited because the charges on the individual particles do not significantly interact with each other and the particles tend to remain sufficiently far apart where the charge forces on the individual particles do not greatly interact, even when small clusters of particles associate on the surface, possibly because of responsive (positive) charge distributions crated on the surface. The application of locally strong or wide area strong field forces then strongly affects the relative position of the particles, possibly by destabilizing the same charged (negatively charged particles in a negative field) nanoparticles, allowing them to less strongly adhere to the surface, causing them to float more freely (as with a small wave lifting small articles from a sand beach), and allowing the interparticles charge effects to more easily order or rearrange the respective particles. The application of forces by an AFM cause those forces to be intense for short durations on a local scale, so that particle rearrangement patterns corresponding to the scan pattern on the surface can be viewed as result of the AFM scan. The field, as indicated above, may be an electromagnetic field, or may be an electrical field or a magnetic field. At present, a preferred field is an electrical field and electrically charged nanoparticles are deposited onto the surface. It is desirable that the surface is a flat surface. Flat is always a relative term, but in the practice of the present technology considerations of this term should be made with respect to a flat surface having less than 5%, less than 3%, less than 2% and preferably less than 1% of the total surface on which particles are deposited with vertical features greater than a number average diameter for the nanoparticles being deposited. For example, if 10 nm nanoparticles are deposited, less than 5% of the total surface area should have peaks or valleys that extend 10 nm or more above or below and average surface plane. As the particles get smaller, the topography variations should get smaller, although with 2 nm particles deposited, less than 5% of surface area with less than 5 nm features is satisfactory. The method, apparatus and system should maintain a vacuum of less than $10^{-5}$ Torr (e.g., $10^{-6}$ Torr is less than $10^{-5}$ Torr, even though it is a stronger vacuum) over the surface while nanoparticles are being deposited. In another alternative, the nanoparticles are magnetically susceptible and the field is a magnetic field. In a system and process control for the rearrangement, the field may be applied to the deposited nanoparticles from a front side of the surface on which the particles are deposited without a field applicator contacting the front side of the surface. Alternatively, field is applied to the deposited nanoparticles from a back side of the surface on which the particles are deposited with a field applicator either contacting or not contacting the back side of the surface. In addition to the field rearranging the particles, a biasing field opposed to the field rearranging the nanoparticles may be applied to provide control over influence of the field rearranging the nanoparticles, either with a same field orientation or an opposite field orientation as described above.

A system or apparatus for forming structures from nanoparticles may comprise:
 a source of nanoparticles;
 a surface for receiving a deposit of nanoparticles;
 a system for maintaining a vacuum over the surface while nanoparticles are being deposited in a first distribution of the nanoparticles;
 a field applicator that applies a field to the first distribution of nanoparticles on the surface, the field applicator applying a force to the particles within the vacuum system.

Computer or processor technology may preferably be integrated into the process, system and apparatus to provide greater automation to the system. The process may be operated in a batch mode or continuous mode, with the substrate moving continuously through the particle source zone, particle application zone, and particle rearrangement zone under a continuous vacuum.

After development of the distribution of the particles on the substrate, the particles, when catalysts or seed materials for the deposition of linear growth materials or even surface growth materials, can be used in any deposition process The fundamental process of the described technology therefore includes forming a patterned array of particles on a substrate, preferably by the proprietary technology of the present disclosure, and then subsequently Once the particles have been formed on a first substrate, which may require properties particularly for the deposition and may therefore be a substrate that is undesirable for the ultimate growth of the nanotubes, because of any reason such as cost, shape, substrate material properties, substrate material appearance and the like. The particles formed on the substrate, if they have not been fixed to the surface (e.g., by activation of a polymerizable coating of material on the surface of the substrate, fusion, heat, pressure or combinations thereof) are formed in a pattern sustained by local destructible forces and may be transferred from the surface to a final substrate surface by any of field control (e.g., magnetic or electrical field application with non-contact transfer of the particles or contact transfer of the particles from the forming substrate to the final substrate.

FIG. 9 shows a schematic of transfer of a patterned set of nanoparticles 506 from a first substrate 502 on which the particles 506 were formed to a final or intermediate receptor substrate 504. A field may be applied in various ways when the field is capable of moving, controlling, directing or otherwise repositioning or forcing the particles 506 so that they transfer from the original substrate 502 on which they were deposited to a second substrate 504 on which the particles are desired to be present in their original pattern or in a modified or different pattern (based upon the control of field and current). For example, the spacing between the two substrates 502 and 504 is selected to be appropriate for the particles used, the fields used, the resolution required, the substrate materials, and the like. A first field 508 may be used from the backside of the substrate 502 to drive the nanoparticles 506 away from the first substrate 502 towards the second substrate 504. For example, if the particles 506 have a negative electrical charge, the application of negative electrical fields or charges as field 508 will motivate particles 506 away from the first substrate 502 towards the second substrate 504. The field or charges 508 may be created or applied on a point-by-point (e.g., stylus or head) basis, a line basis (moving a wire or edge that covers a length across a section of the backside), or a field basis (e.g., having a wide area array of electrodes or generators. Magnetic fields may be applied from the backside of the first substrate 502 as the sole driving force only if there is an opposite polarity between the particles 506 and the magnetic field, or is the magnetic field 508 is applied as a control or biasing field in combination with a stronger defining field, such as field 512 on the opposite side of the second substrate 504. That field 512 would draw a magnetically susceptible particle or different polarity magnetic particle from the first substrate 502 to the second substrate 504 and might be controlled, enhanced or balanced partially by the first field 508. A field 510 may be applied across the area between the two substrates 502 and 504 to move particles from one surface to another. Contact pressure and heat in combination with these fields may be used to move or fix the particles. For example, if the original substrate were silicon wafers (silica) and the second substrate was a polymeric material (particularly a heat softenable polymeric material), heat and/or pressure could be used to fix the nanoparticles to the second substrate 504 without fixing particles to the first substrate.

Figure 10:
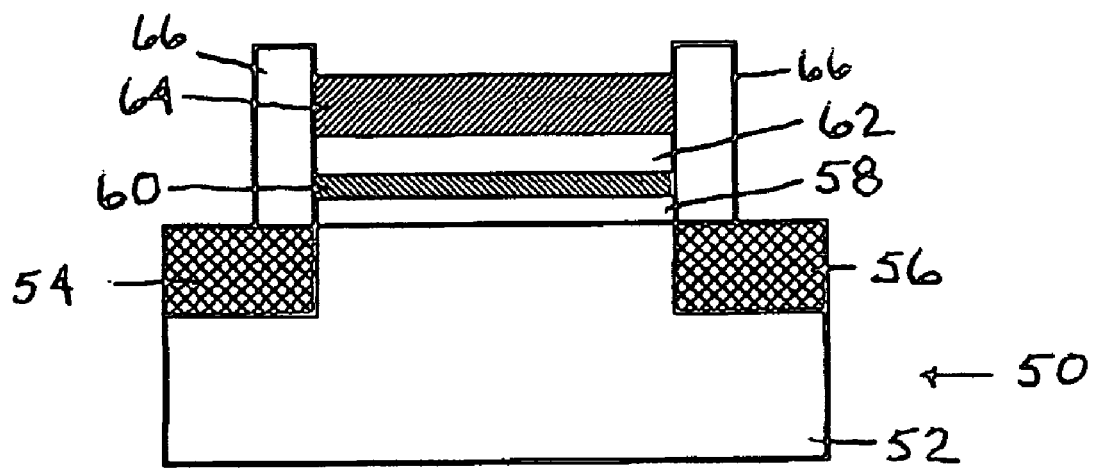
FIG. 10 (PRIOR ART) shows a typical structure for a common Flash memory device.

FIG. 10 (PRIOR ART) shows a typical structure for a common Flash memory device 50. The device 50 has a transistor base 52 with a source of current 54 and a drain for current 56. The transistor base 52 is typically covered with an electrically insulative layer 58, such as a thin layer of inorganic oxide such as metal oxide or metalloid oxide (Hafnium oxide), silicon oxides (e.g., $SiO_2$), ceramic oxides, and the like. Above the electrically insulating layer is a floating gate 60, a thin electrically conductive layer such as a thin metal layer. A second electrically insulating layer 62 (oftened referred to as the control oxide layer) is positioned above the floating gate 60 and then another electrically conductive layer 64 and a defining field oxide layer 66 (another electrically insulating layer) completes the typical Prior Art flash memory device. The various electrically insulating layers may comprise the same, similar or different compositions, as may other layers similarly characterized, such as the electrically conductive layers.

Figure 11:
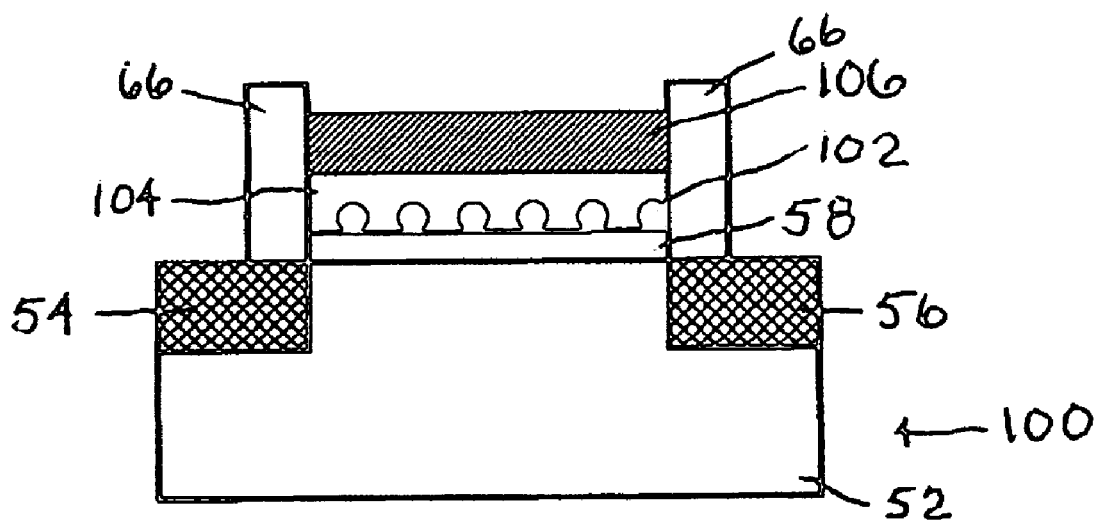
FIG. 11 shows a cross-section view of a basic flash memory device according to one non-limiting practices of technology described herein.

FIG. 11 shows a cross-section view of a basic flash memory device 100 according to practices of technology described herein. The device 100 has a transistor base 52 with a source of current 54 and a drain for current 56. The transistor base 52 is typically covered with an electrically insulative layer 58, such as a thin layer of inorganic oxide such as metal oxide or metalloid oxide (Hafnium oxide), silicon oxides (e.g., $SiO_2$), ceramic oxides, and the like. Above the electrically insulating layer is a distribution of conductive nanoparticles 102, preferably nanospheres or other highly symmetrical conductive particles. The individual nanoparticles 102 are in contact with the surface of the tunnel oxide layer 58, providing minimum contact with that layer because of the relatively small surface area of the sphere nanosphere 102 that is available for contact with the tunnel oxide layer 58. This structure of the relatively small contact area contacting or facing the tunnel oxide layer is believed to offer the possibility of reduced leakage between the conductive layer of the nanospheres 102 and the transistor base 52. As leakage is a significant issue in flash memory, especially as layers are attempted to be made thinner and thinner, this structural feature that can enable reduced leakage can be a significant advance, allowing yet again thinner layers, but without necessarily increasing leakage. The conductive nanoparticles 102 are further supported in a layer or matrix 104 of electrically insulating material, such as a further oxide layer or a continuation of the composition of the tunnel oxide layer 58. Above the control oxide layer 104 is placed a control gate 106 and again a defining field oxide layer 66 (another electrically insulating layer) completes the flash memory. Other known structural modifications for use with standard flash memory units may also be provided along with this novel design. The flash memory unit should be indistinguishable from other flash memory units, depending upon the number and density of nanoparticles used, with the exception that there should be reduced leakage, as described above.

Figure 11A:
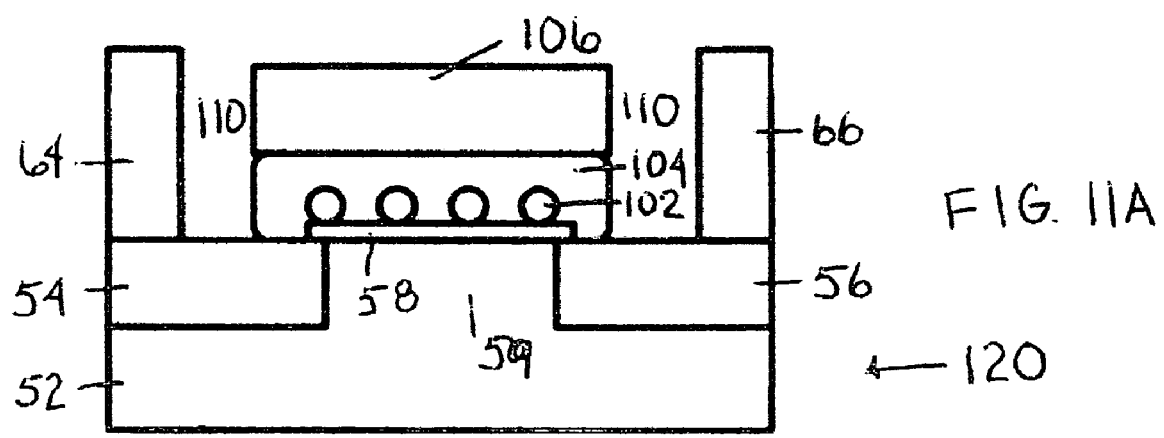
FIG. 11A shows a cross-section view of a basic flash memory device according to a second non-limiting practices of technology described herein.

FIG. 11A shows a cross-section view of a basic flash memory device 120 according to a second non-limiting practices of technology described herein. All numbers in the figure represent the same elements as identified by like numbers in FIG. 11. Spacing 110 is shown between field oxide layers 66 and the central gate structure composed of the tunnel oxide layer 58, the conductive layer of nanospheres 102, the control oxide layer 104 and the control gate 106.

Figure 12:
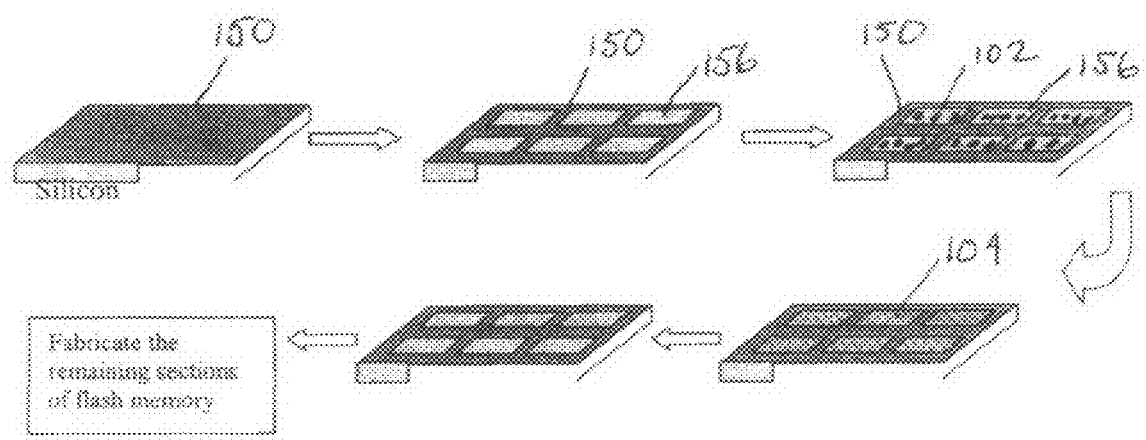
FIG. 12 shows a flow diagram of the movement of elements through one embodiment of proposed and described manufacturing processes of the present technology.

In the method of distributing nanoparticles over a surface described above, lies a significant technical advance in a method for manufacturing the novel flash memory units that have been described herein. Consider in the process described above that the conductive particles are being deposited on transistor panels, with regions of insulating layers (e.g., the tunnel oxides). By being able to control the distribution and density of particle distribution on the tunnel oxide layers, excellent control of conductive properties can be designed and manufactured with simple adjustments in the process. FIG. 12 will examine such a process.

FIG. 12 shows a flow diagram of the movement of elements through the proposed and described manufacturing process of the present technology. Initially, a transistor substrate 150 is introduced into the process stream. Any standard transistor substrate should be useful in the practice of this technology. Patterns or zones 156 may be etched or coated to define gate regions to be constructed on the transistor substrate 150. Tunnel oxide is formed (e.g., deposited, coated, vapor coated, formed, etc.) on the defined areas in the patterns or zones 156 to form patterns of tunnel oxide 158 over the transistor base 150. Using the process described above for the accurate distribution of nanoparticles onto a surface, a deposit of nanoparticles 102 is formed over the tunnel oxide patterns 158. The control oxide layer 104 is then formed over the designed distribution of conductive nanoparticles, securing the conductive nanoparticles and encapsulating them so that the structure of the conductive layer defined and formed by the particles remains stable. Over this control oxide layer, the final control gate (not shown) and any additional features may be added.

As noted above, FIG. 11A shows a cross-section view of a basic flash memory device 120 according to a second non-limiting practices of technology described herein. All numbers in the figure represent the same elements as identified by like numbers in FIG. 11, but alternative descriptions for elements are known in the art, such as a semiconductor substrate 52, source implant 54, drain implant 56, channel 59, tunnel oxide 58, nanoparticle array 102, control gate oxide 104, source 64, drain 66, and control gate 106. Spacing 110 is shown between field oxide layers 66 and the central gate structure composed of the tunnel oxide layer 58, the conductive layer of nanospheres 102, the control oxide layer 104 and the control gate 106.

Other options, variations, alternatives and controls over the system will be apparent to those skilled in the art upon reading this technical disclosure.

What is claimed is:

1. A method of forming flash memory devices from nanoparticles comprising:
    providing a source of conductive nanoparticles consisting essentially of spherical particles having an average diameter of between 1 nm and 20 nm with a standard deviation of number average diameter of less than 15% and a symmetrical shape;
    providing a transistor base;
    providing a first electrically insulating layer over a surface of the transistor base to provide an electrically insulating surface distal from the transistor base;
    depositing the conductive spherical nanoparticles to the surface of the transistor base in a first distribution of the spherical nanoparticles;
    applying a field to the conductive spherical nanoparticles on the surface of the transistor base that applies a force to the spherical particles;
    rearranging the spherical conductive nanoparticles on the surface of the transistor base by the force from the field to form a second distribution of conductive spherical nanoparticles on the surface of the transistor that is more ordered or more patterned than the first distribution of conductive spherical nanoparticles; and
    overlaying a second electrically insulating layer over the second distribution of conductive spherical nanoparticles.

2. The method of claim 1 wherein the field is an electrical field or a magnetic field.

3. The method of claim 2 wherein a metal layer is provided over the second electrically insulating layer to form a gate.

4. The method of claims 3 wherein the nanoparticles comprise spheres of metal.

5. A method of forming flash memory devices from nanoparticles comprising:
    providing a source of conductive nanoparticles;
    providing a transistor base;
    providing a first electrically insulating layer over a surface of the transistor base to provide an electrically insulating surface distal from the transistor base;
    depositing the conductive nanoparticles to the surface of the transistor base in a first distribution of the nanoparticles;
    applying an electrical field or magnetic field to the conductive nanoparticles on the surface of the transistor base that applies a force to the particles;
    rearranging the conductive nanoparticles on the surface of the transistor base by the force from the field to form a second distribution of conductive nanoparticles on the surface of the transistor that is more ordered or more patterned than the first distribution of conductive nanoparticles;
    overlaying a second electrically insulating layer over the second distribution of conductive nanoparticles; and
    providing a metal layer over the second electrically insulating layer to form a gate, wherein the nanoparticles comprise spheres of metal wherein the surface of the first electrically conductive layer distal from the transistor base is a flat surface having less than 1% of the flat surface with vertical features greater than a number average diameter for the nanoparticles being deposited.

6. A method of forming flash memory devices from nanoparticles comprising:
providing a source of conductive nanoparticles;
providing a transistor base;
providing a first electrically insulating layer over a surface of the transistor base to provide an electrically insulating surface distal from the transistor base;
depositing the conductive nanoparticles to the surface of the transistor base in a first distribution of the nanoparticles;
applying an electrical field or magnetic field to the conductive nanoparticles on the surface of the transistor base that applies a force to the particles;
rearranging the conductive nanoparticles on the surface of the transistor base by the force from the field to form a second distribution of conductive nanoparticles on the surface of the transistor that is more ordered or more patterned than the first distribution of conductive nanoparticles;
overlaying a second electrically insulating layer over the second distribution of conductive nanoparticles; and
providing a metal layer over the second electrically insulating layer to form a gate; wherein a vacuum of less than $10^{-5}$ Torr is maintained over the surface of the transistor base continuously while the conductive nanoparticles are being deposited and until the second electrically insulating layer is provided.

7. A method of forming flash memory devices from nanoparticles comprising:
providing a source of conductive nanoparticles;
providing a transistor base;
providing a first electrically insulating layer over a surface of the transistor base to provide an electrically insulating surface distal from the transistor base;
depositing the conductive nanoparticles to the surface of the transistor base in a first distribution of the nanoparticles;
applying an electrical field or magnetic field to the conductive nanoparticles on the surface of the transistor base that applies a force to the particles;
rearranging the conductive nanoparticles on the surface of the transistor base by the force from the field to form a second distribution of conductive nanoparticles on the surface of the transistor that is more ordered or more patterned than the first distribution of conductive nanoparticles;
overlaying a second electrically insulating layer over the second distribution of conductive nanoparticles; and
providing a metal layer over the second electrically insulating layer to form a gate; wherein a discontinuous layer is formed by the conductive nanoparticles, and the discontinuous layer has a projected coverage of between 10% and 67% of a projected area.

8. The method of claim 1 wherein the field is applied to the deposited nanoparticles from a) a front side of the surface of the transistor base on which the particles are deposited without a field applicator contacting the front side of the surface of the transistor base or b) from a back side of the surface of the transistor base on which the particles are deposited with a field applicator either contacting or not contacting the back side of the transistor base.

9. The method of claim 3 wherein recesses are formed in the transistor base and the first electrically insulating layer is formed at least within the recesses before depositing the conductive nanoparticles.

10. The method of claim 3 wherein in addition to the field rearranging the particles, a biasing field opposed to the field rearranging the nanoparticles is applied to provide control over influence of the field rearranging the nanoparticles.

11. The method of claim 9 wherein the conductive particles comprise spherical metal nanoparticles.

12. The method of claim 4 wherein the metal of the metal spherical particles is a different metal from the metal of the metal conductive layer over the second electrically insulating layer.

13. The method of claim 4 wherein the metal of the metal spherical particles is the same metal as the metal of the metal conductive layer over the second electrically insulating layer.

14. A method of forming flash memory devices from nanoparticles comprising:
providing a source of conductive nanoparticles;
providing a transistor base;
providing a first electrically insulating layer over a surface of the transistor base to provide an electrically insulating surface distal from the transistor base;
depositing the conductive nanoparticles to the surface of the transistor base in a first distribution of the nanoparticles;
applying an electrical field or magnetic field to the conductive nanoparticles on the surface of the transistor base that applies a force to the particles;
rearranging the conductive nanoparticles on the surface of the transistor base by the force from the field to form a second distribution of conductive nanoparticles on the surface of the transistor that is more ordered or more patterned than the first distribution of conductive nanoparticles;
overlaying a second electrically insulating layer over the second distribution of conductive nanoparticles; and
providing a metal layer over the second electrically insulating layer to form a gate, wherein the nanoparticles comprise spheres of metal, wherein the metal of the metal spherical particles is the same metal as the metal of the metal conductive layer over the second electrically insulating layer and wherein recesses are formed in the transistor base and the first electrically insulating layer is formed at least within the recesses before depositing the conductive nanoparticles.

15. The method of claim 14 wherein a discontinuous layer is formed by the conductive nanoparticles, and the discontinuous layer has a projected coverage of between 10% and 67% of a projected area.

* * * * *